US012334909B2

United States Patent
Hofer et al.

(10) Patent No.: US 12,334,909 B2
(45) Date of Patent: Jun. 17, 2025

(54) MULTI-LEVEL STACKED ACOUSTIC WAVE (AW) FILTER PACKAGES AND RELATED FABRICATION METHODS

(71) Applicant: RF360 Singapore Pte. Ltd., Singapore (SG)

(72) Inventors: Manuel Hofer, Graz (AT); Xavier Perois, Mouans Sartoux (FR); Michael Wick, Munich (DE); Jeroen Bielen, Molenhoek (NL); Stefan Leopold Hatzl, Kloech (AT); Juergen Portmann, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 939 days.

(21) Appl. No.: 17/481,811

(22) Filed: Sep. 22, 2021

(65) Prior Publication Data
US 2023/0090842 A1    Mar. 23, 2023

(51) Int. Cl.
*H03H 9/145*    (2006.01)
*H03H 3/08*    (2006.01)
(Continued)

(52) U.S. Cl.
CPC ................ *H03H 9/64* (2013.01); *H03H 3/08* (2013.01); *H03H 9/105* (2013.01); *H03H 9/145* (2013.01); *H03H 9/25* (2013.01)

(58) Field of Classification Search
CPC .......... H03H 9/64; H03H 9/105; H03H 9/145; H03H 9/25
(Continued)

(56) References Cited

U.S. PATENT DOCUMENTS 7,596,849 B1    10/2009 Carpenter et al.
2013/0257221 A1*  10/2013 Yamaji ................... H03H 9/132
                                                              310/313 B
(Continued)

FOREIGN PATENT DOCUMENTS

WO    2018221172 A1    12/2018

OTHER PUBLICATIONS

Invitation to Pay Additional Fees and Partial International Search for International Patent Application No. PCT/EP2022/073325, mailed Dec. 21, 2022, 14 pages.
(Continued)

*Primary Examiner* — Derek J Rosenau
(74) *Attorney, Agent, or Firm* — Withrow & Terranova, PLLC

(57) ABSTRACT

A multi-level stacked AW filter package including a first acoustic wave (AW) filter stacked on a second AW filter employs semiconductor fabrication methods and structures, including a metallization layer comprising interconnects to couple a contact surface to the second AW filter. Each AW filter includes an AW filter circuit on a semiconductor substrate. A second substrate disposed on a frame on the substrate protects the AW filter circuit. In a multi-level AW filter package, the second substrate of the first AW filter comprises a glass substrate with a similar expansion rate as the semiconductor substrate. The interconnects coupling the second AW filter to the contact surface are disposed on insulators on the side wall surfaces of the semiconductor substrates of the first AW filter for isolation. In a stacked AW filter package comprising a single AW filter, the interconnects couple the contact surface to the AW filter.

33 Claims, 11 Drawing Sheets

(51) Int. Cl.
*H03H 9/10* (2006.01)
*H03H 9/25* (2006.01)
*H03H 9/64* (2006.01)

(58) Field of Classification Search
USPC ..... 310/313 R, 313 A, 313 B, 313 C, 313 D, 310/348
See application file for complete search history.

(56) References Cited

U.S. PATENT DOCUMENTS

| | | | |
|---|---|---|---|
| 2015/0280688 A1* | 10/2015 | Ortiz | H10N 30/88 310/313 R |
| 2017/0288123 A1 | 10/2017 | Hatano et al. | |
| 2018/0013055 A1 | 1/2018 | Metzger et al. | |
| 2020/0153409 A1* | 5/2020 | Hsu | H01L 24/32 |
| 2020/0321939 A1 | 10/2020 | Turner et al. | |
| 2021/0036682 A1 | 2/2021 | Kamgaing et al. | |
| 2021/0036685 A1 | 2/2021 | Kamgaing et al. | |

OTHER PUBLICATIONS

International Search Report and Written Opinion for International Patent Application No. PCT/EP2022/073325, mailed Feb. 13, 2023, 20 pages.

* cited by examiner

MULTI-LEVEL STACKED ACOUSTIC WAVE (AW) FILTER PACKAGES AND RELATED FABRICATION METHODS

BACKGROUND

I. Field of the Disclosure

The field of the disclosure relates to acoustic wave (AW) filter packages, including AW filters with AW filter circuits on substrates and stacking substrates comprising AW filter circuits.

II Background

Manufacturers of mobile wireless devices can make new devices attractive to buyers by increasing the functional capabilities of the devices with each new generation. Increasing the capability of a device typically requires more circuitry be added, which occupies more space, but the device sizes of hand-held devices, for example, are based on the sizes of human hands, which remain the same. Methods for achieving an increase in function without an increase in device size include reducing the dimensions of circuits providing the functional capabilities so that more circuits can fit into the internal space of a device. A reduction in the area of transistors and wires can increase circuit density, making it possible to reduce a size of a semiconductor chip or to put more circuitry on a semiconductor chip of a given size. Another method for increasing the number of integrated circuits (ICs) in a package is three-dimensional (3D) IC stacking. By this method, an area previously occupied by two ICs placed side-by-side may be reduced (e.g., cut in half) by vertically stacking one IC over another in the same horizontal area, resulting in only a small increase in package height. The active circuits in stacked ICs are enveloped in layers of metal, dielectric materials, insulators, and/or molding compounds, and stacking ICs in a package may not significantly interfere with their operation.

Hand-held devices also include wireless devices that include radio frequency (RF) circuits. RF circuits include analog filters that are conventionally formed as acoustic wave (AW) devices containing AW filter circuits. Examples of AW filter circuits include surface acoustic wave (SAW) filter circuits and bulk acoustic wave (BAW) filter circuits. An AW filter circuit converts an electrical input signal into acoustic waves in a piezoelectric material. In one example, a SAW filter circuit includes a first interdigital transducer (IDT) on a surface of piezoelectric material configured to receive an RF signal and a second IDT on the surface configured to generate a filtered RF signal. The RF signal is converted into acoustic waves that propagate through the surface of the piezoelectric material from the first IDT to the second IDT. The acoustic waves in the SAW filter circuit need to be protected from physical contact, which would interfere with wave propagation. The protection is provided by providing a cavity or air space above the surface of the substrate. Since such cavities are necessary to protect an AW filter circuit and stacked ICs do not require such cavities, AW filter devices have not been stacked by the conventional methods used in 3D IC stacking.

SUMMARY OF THE DISCLOSURE

Exemplary aspects disclosed in the detailed description include multi-level, stacked acoustic wave (AW) filter packages that include structures to support stacked AW filters. Related fabrication methods are also disclosed. Certain structures and fabrication methods disclosed herein that support a multi-level stacked AW filter package can also be employed in an AW filter package that only includes a single AW filter. In this regard, AW filter packages disclosed herein include one or more AW filters that each include a first substrate comprising a first surface (e.g. a piezoelectric material) with at least one AW filter circuit disposed thereon. Each AW filter circuit comprises first and second interdigital transducers (IDTs) to provide radio frequency (RF) signal filtering. Each AW filter also includes a frame coupled to the first substrate and surrounding the at least one AW filter circuit. A second substrate (e.g., a cap substrate) disposed on the frame encloses an air cavity inside the frame between the first substrate and the second substrate. In one exemplary aspect, the AW filter package includes a multi-level AW filter package that includes multiple AW filters stacked in a vertical direction in a stacked arrangement to include multiple filter circuits to filter multiple frequencies or frequency bands. The multi-level AW filter package includes a first, top AW filter, including at least a first AW filter circuit disposed on a first substrate, and a second substrate disposed on a first frame disposed on the first substrate. The first substrate disposed on a second frame disposed on a third substrate encloses a second, bottom AW filter including at least a second AW filter circuit to form the multi-level AW filter package. The first substrate and the third substrate can be formed from a semiconductor material as semiconductor substrates. Fabricating the first substrate and the third substrate as semiconductor substrates can allow the AW filter package to be fabricated using semiconductor fabrication processes and techniques used in fabricating semiconductor die packages.

In a first exemplary aspect of a multi-level AW filter package, metal interconnects provided for the first AW filter are separate from metal interconnects provided for the second AW filters to provide separate signal paths for receiving RF signals in the respective AW filter circuits from contact pads on a contact surface of the second substrate and providing respective filtered RF signals to the contact pads on the contact surface. In this regard, first metal interconnects in the form of metalized vertical interconnect accesses (vias) are disposed through the second substrate to a surface of the first substrate to provide interconnect paths for the first, top AW filter. Further, metallization layers that include second metal interconnects are formed on the outer perimeter walls of the stacked AW filters to provide interconnect paths for the AW filter circuits of the second, bottom AW filter that are physically and electrically separated from the interconnect paths of the first, top AW filter. The second metal interconnects of the metallization layers provide interconnect paths between the second, bottom AW filter circuit and first contact pads on the contact surface of the second substrate of the first, top AW filter. Forming the interconnect paths of an AW filter in an AW filter package as metal interconnects in metallization layers, such as redistribution layers (RDLs) for example, allows metallization layer fabrication processes (e.g., RDL, fabrication processes) to be employed to fabricate the AW filter package. Metal interconnects in metallization layers can be employed to provide metal interconnects for interconnect paths of an AW filter, even in an AW filter package that only includes a single AW filter and does not include stacked AW filters. Also, in the example of AW filter packages, side wall surfaces of the second substrate, the first substrate, and the third substrate can be staggered in a horizontal direction to support the formation of the metallization layers on the outer perimeter walls of the stacked AW filters to provide the interconnect paths from the contact pads on the contact surface of the second substrate to the second, bottom AW filter circuit. The staggered side wall surfaces create shoulder areas on the first substrate that extend out from the second substrate and, in the multi-level AW filter package, create lower shoulder areas on the third substrate that extend out from the first substrate of the AW filter package. The staggered side wall surfaces provide support for the formation of the metal interconnects on the outer perimeter walls of the stacked AW filters and avoid overlaps that create "negative exposure" areas where the metal interconnects may not be able to be formed.

In another exemplary aspect of a multi-level AW filter package, metal interconnects (e.g., RDL interconnects) are formed on the outer perimeter walls of the stacked AW filters to provide an interconnect path from the contact surface of the second substrate to the second, bottom AW filter that necessarily extends onto the outer walls of the first substrate of the first, top AW filter before extending down to the third substrate of the second, bottom AW filter. The first substrate of the first, top AW filter is disposed between the second substrate and the third substrate of the second, bottom AW filter. Thus, electrical signals carried in the second metal interconnects in the interconnect path from the contact pads on the second substrate down to the third substrate of the second AW filter may come into electrical contact with the first substrate of the first, top AW filter, causing a leakage current path between the second metal interconnects and the at least one AW filter circuit of the first, top AW filter. A leakage current may interfere with the performance of AW filter circuits on the first substrate and the third substrate. In this regard, in another exemplary aspect, one or more insulating layers are disposed on the outer perimeter walls of the stacked AW filters between the first substrate and the second metal interconnects. The second metal interconnects are formed over the one or more insulating layers disposed on the outer perimeter walls of the stacked AW filters. In this manner, the electrical signals carried by the second metal interconnects are isolated and insulated from the first substrate of the first, top AW filter.

In another exemplary aspect of an AW filter package, the second substrate of the first, top AW filter can be made of a glass material that can be laser processed to allow precise openings to be formed in the second substrate to form the metalized vias for the first metal interconnects to the first AW filter circuit. A glass second substrate may also advantageously provide mechanical robustness and stability to the AW filter package. The Coefficient of Thermal Expansion (CTE) of glass is higher than the CTE of a polymer material that has conventionally been used to form a second substrate, for example. Especially for stacked, multi-level AW filter packages where multiple AW filter cavities are formed on each substrate in a stacked arrangement, it is important to provide mechanical stability to the AW filter package to avoid any fracture of the second substrate or first substrate due to deflection in the filter cavities. Also, using a glass second substrate can provide mechanical stability for substrates of reduced thickness that are employed to keep the overall height of the AW filter package within a desired height budget.

In one exemplary aspect, a stacked AW filter package is disclosed. The stacked AW filter package comprises a first substrate comprising a first surface; an AW filter circuit on the first surface of the first substrate; a frame disposed on the first surface of the first substrate; a second substrate comprising a contact surface and a side wall surface, the second substrate disposed on the frame to form a cavity between the AW filter circuit and the second substrate; and a metallization layer comprising at least one metal interconnect coupled to the contact surface of the second substrate and the first surface of the first substrate, the at least one metal interconnect disposed on the side wall surface of the second substrate.

In another exemplary aspect, a method of fabricating a stacked AW filter package is disclosed. The method comprises firming a first substrate comprising a first surface; forming an AW filter circuit on the first surface of the first substrate; forming a frame on the first surface of the first substrate; forming a second substrate comprising a contact surface and a side wall surface; disposing the second substrate on the frame to form a cavity between the AW filter circuit and the second substrate; and forming a metallization layer comprising at least one metal interconnect coupled to the contact surface of the second substrate and the first surface of the first substrate, the at least one metal interconnect disposed on the side wall surface of the second substrate.

In another exemplary aspect, a stacked AW filter package is disclosed. The stacked AW filter package comprises a first substrate comprising a first surface and a side wall surface; a first AW filter circuit on the first surface of the first substrate; a first frame disposed on the first surface of the first substrate; a second substrate comprising a contact surface and a side wall surface, the second substrate stacked on the first frame to form a cavity between the first AW filter circuit and the second substrate; a third substrate comprising a second AW filter circuit on a second surface of the third substrate; a second frame disposed on the second surface of the third substrate; the first substrate disposed on the second frame to form a second cavity between the second AW filter circuit and the first substrate; a metallization layer comprising at least one metal interconnect coupled to the contact surface of the second substrate and the second surface of the third substrate, the at least one metal interconnect disposed on the side wall surface of the first substrate; and an insulator disposed on the side wall surface of the first substrate between the side wall surface of the first substrate and the at least one metal interconnect.

In another exemplary aspect, a method of fabricating a stacked AW filter package is disclosed. The method comprises forming a first substrate comprising a first surface and a side wall surface; forming a first AW filter circuit on the first surface of the first substrate; forming a first frame on the first surface of the first substrate; forming a second substrate comprising a contact surface and a side wall surface; disposing the second substrate on the first frame to form a first cavity between the first AW filter circuit and the second substrate; forming a third substrate comprising a second AW filter circuit on a second surface of the third substrate; forming a second frame on the second surface of the third substrate; disposing the first substrate on the second frame to form a second cavity between the second AW filter circuit and the first substrate; forming an insulator on the side wall surface of the first substrate; and forming a metallization layer comprising at least one metal interconnect coupled to the contact surface of the second substrate and the second surface of the third substrate, the at least one metal interconnect disposed on the insulator on the side wall surface of the first substrate.

DETAILED DESCRIPTION

Figure 1:
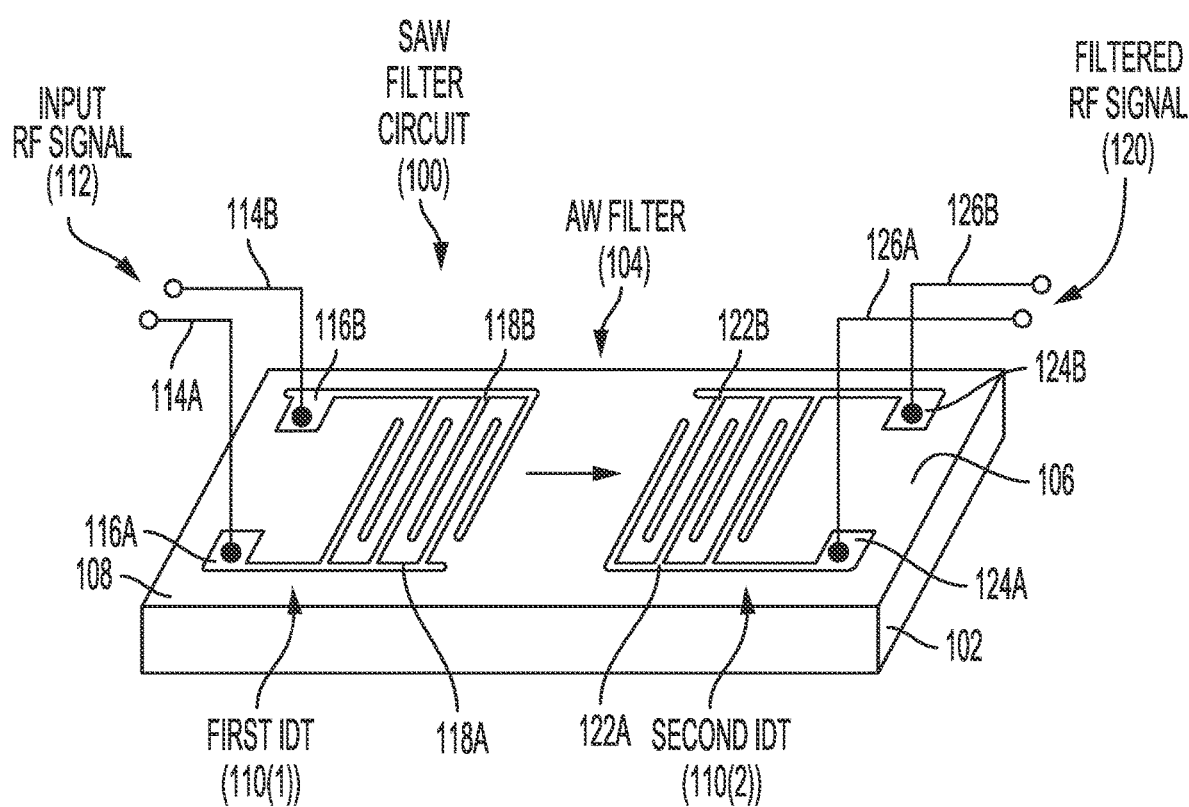
FIG. 1 is an illustration of one example of a surface acoustic wave (SAW) device that may be employed in stacked acoustic wave (AW) filter packages.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Before discussing exemplary aspects of stacked acoustic wave (AW) filter packages of one or more AW filters that each include at least one AW filter circuit on a first substrate and a second substrate (e.g., cap substrate) disposed on a frame to provide a protective cavity over the AW filter circuit, as illustrated in FIGS. 2A-2C, FIG. 1 is discussed. FIG. 1 is an illustration of a surface acoustic wave (SAW) filter circuit 100 on a first substrate 102 that may be employed in an AW filter 104 in a stacked AW filter package. Though not shown here, the AW filter 104 will include a second substrate disposed on a frame on the first substrate 102 to form a cavity to protect the AW filter circuit 100 from acoustic interference, as disclosed herein. In this regard, FIG. 1 is a perspective view of the AW filter 104, which is configured to pass certain frequency ranges while blocking other frequencies of an input radio frequency (RF) signal. The AW filter 104 may be included in another integrated circuit (IC) package that includes RF transmission/reception circuitry and antennas, where the SAW filter circuit 100 is employed to filter transmitted and/or received RF signals. The first substrate 102 includes a piezoelectric material 106 forming a first surface 108 in this example. A first interdigital transducer (IDT) 110(1) is disposed on the first surface 108 of the first substrate 102 as an input circuit. A second EDT 110(2) is also disposed on the first surface 108 of the first substrate 102 as an output circuit adjacent to the first IDT 110(1). The first IDT 110(1) is configured to receive an input RF signal 112 through first metal interconnects 114A, 114B coupled to first metal contacts 116A, 116B, respectively. The first metal contacts 116A, 116B (e.g., solder bumps, solder balls) on the first substrate 102 connect to the first IDT 110(1). The first IDT 110(1) includes interdigitated metal interconnects 118A, 118B (e.g., metal lines, metal traces) and is configured to convert the received electrical input RE signal 112 into acoustic waves that propagate on the first surface 108 of the substrate 102 from the first IDT 110(1) to the second IDT 110(2). The first IDT 110(1) is configured to emit an acoustic wave on the first surface 108, and the second IDT 110(2) is configured to receive a filtered acoustic wave and convert the filtered acoustic wave into a filtered RF signal 120. The second IDT 110(2) includes interdigitated metal interconnects 122A, 122B coupled to second metal contacts 124A, 124B, respectively, which provide the filtered RE signal 120 to second metal interconnects 126A, 126B. In some examples, a SAW substrate corresponding to the first substrate 102 may include multiple SAW filter circuits 100. Similarly, a bulk acoustic wave (BAW) substrate may include multiple BAW filter circuits.

Figure 2A:
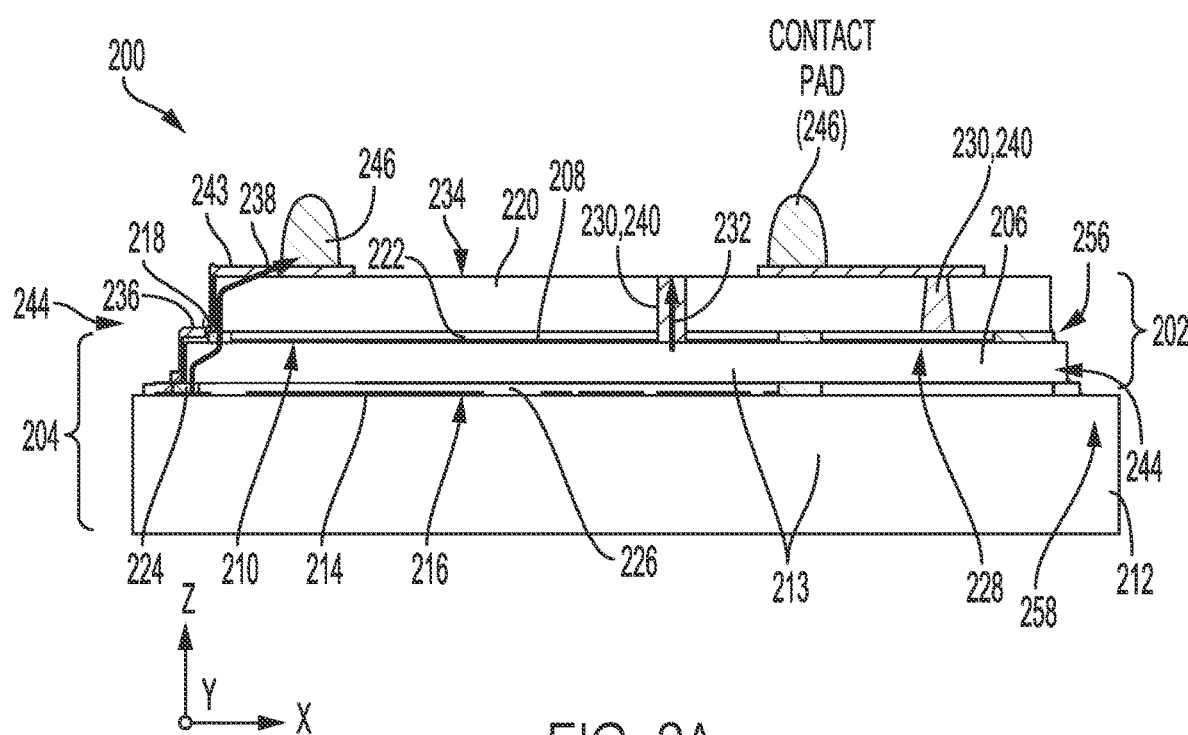
FIGS. 2A-2C are cross-sectional side views of a multi-level stacked AW filter package including a first substrate of a first, top AW filter, a second substrate stacked on the first substrate, the first substrate stacked on a third substrate of a second, bottom AW filter, and a metal interconnect in a metallization layer on the outer perimeter walls of the stacked AW filters coupling the second, bottom AW filter to contact pads on the second substrate.
Figure 2B:
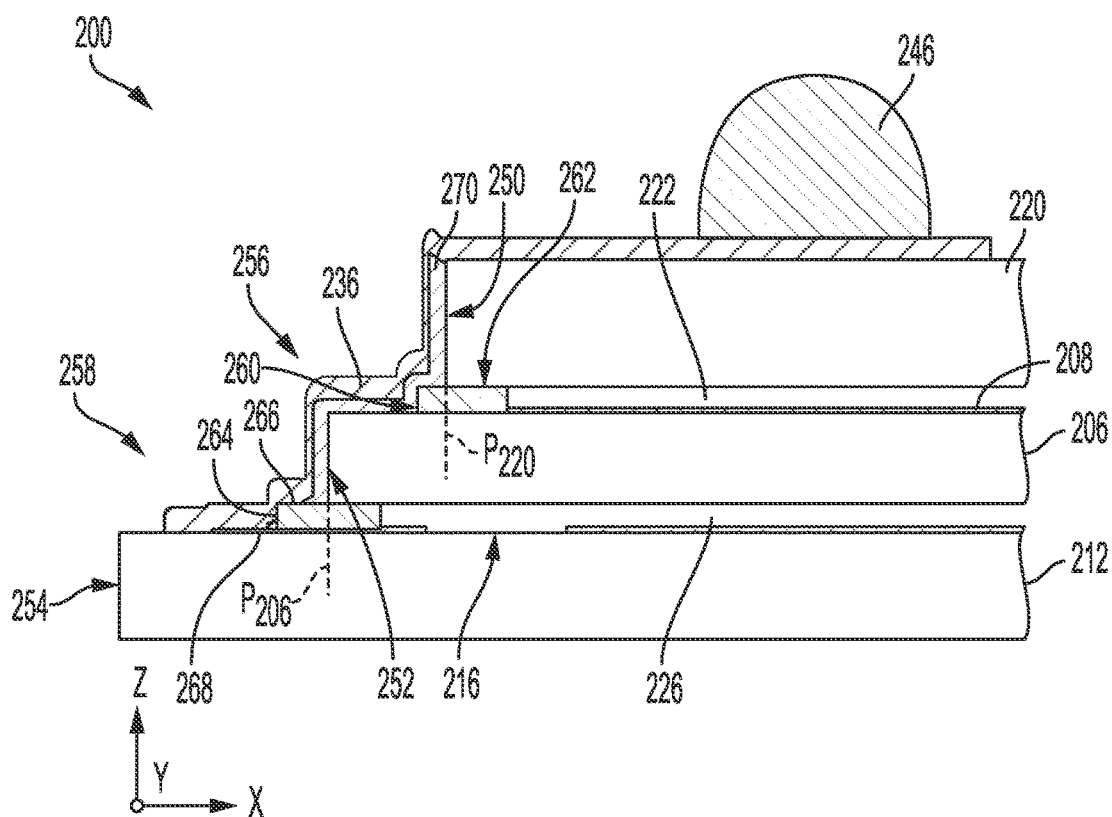
Figure 2C:
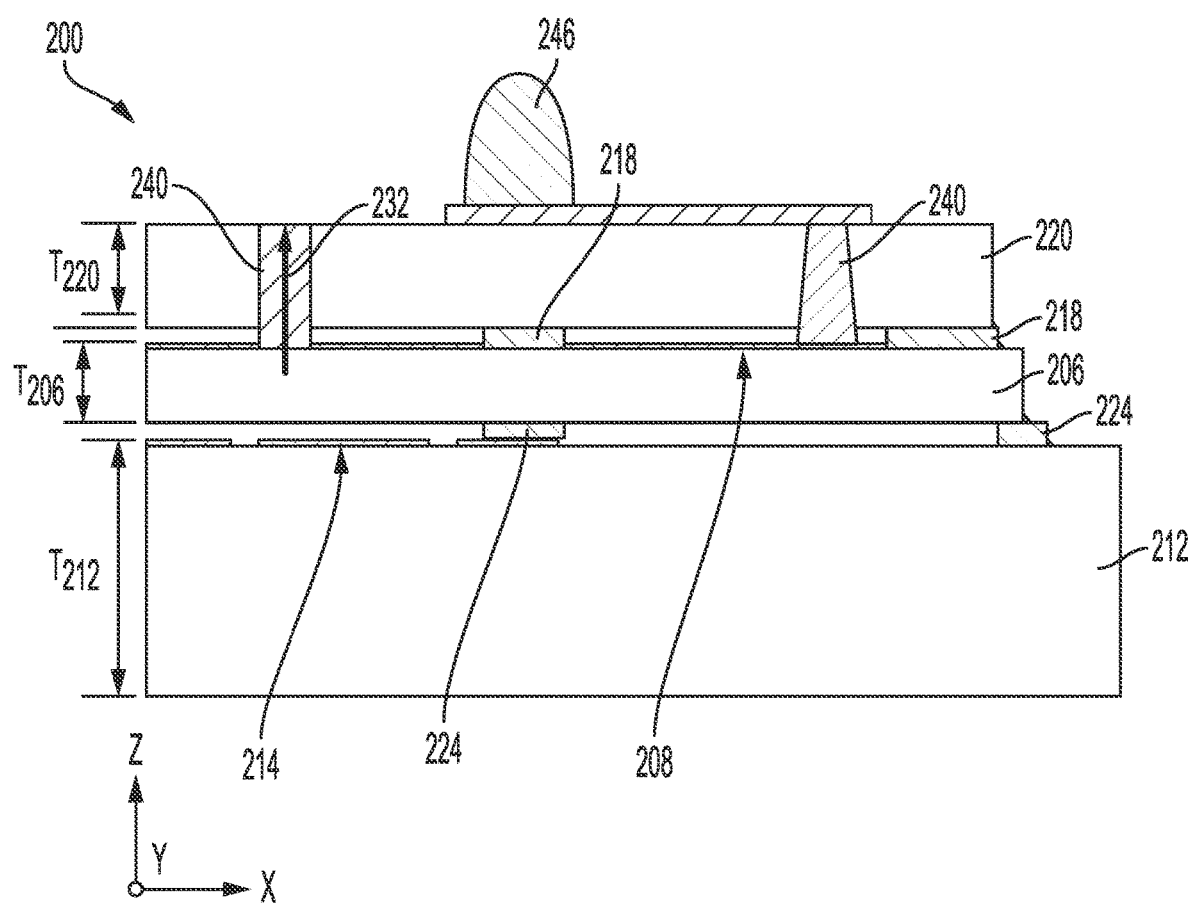

Exemplary aspects disclosed herein support a multi-level stacked AW filter package 200 as shown in a cross-sectional side view in FIGS. 2A-2C, which includes a first, top AW filter 202 ("first AW filter 202") and a second, bottom AW filter 204 ("second AW filter 204") that include, respectively, a first substrate 206 comprising at least one first AW filter circuit 208 disposed on a first surface 210 thereof, and a third substrate 212 comprising at least one, second AW filter circuit 214 disposed on a second surface 216. The first substrate 206 and the third substrate 212 include the first AW filter circuit 208 and the second AW filter circuit 214, respectively, disposed thereon. The multi-level stacked AW filter package 200 may also be referred to herein as the "stacked AW filter package 200" or the "AW filter package 200."

The first AW filter circuit 208 and the second AW filter circuit 214 each provide RE signal filtering. The first AW filter 202 includes a first frame 218 coupled to the first substrate 206 and surrounding the at least one first AW filter circuit 208. A second substrate 220 disposed on the first frame 218 encloses a first cavity 222 (e.g., an air cavity) above the first AW filter circuit 208, inside the first frame 218, and between the first substrate 206 and the cap substrate 220. The second substrate 220, by being disposed on the first frame 218, forms a cap structure which can also be referred to herein as "cap substrate 220." The second AW filter 204 includes a second frame 224 coupled to the third substrate 212 and surrounding the at least one, second AW filter circuit 214. The first substrate 206 of the first AW filter 202 is disposed on the second frame 224 to provide a cap structure that encloses a second cavity 226 (e.g., an air cavity) inside the second frame 224 between the first substrate 206 and the third substrate 212. In this regard, the multi-level AW filter package 200 includes multiple AW filters stacked in a vertical direction in a stacked arrangement to include multiple filter circuits to filter multiple frequencies or frequency bands.

The first substrate 206 and the third substrate 212 can be formed from a semiconductor material as semiconductor substrates 213 to take advantage of semiconductor fabrication processes and techniques used in fabricating semiconductor die packages that can be less expensive than conventional processes in which substrates are formed of a piezoelectric material. Fabricating the first substrate 206 and the third substrate 212 includes forming semiconductor substrates 213, such as silicon substrates, with the first and second surfaces 210, 216 comprising a piezoelectric material 228. The piezoelectric material 228 may be any appropriate piezoelectric material including, but not limited to, quartz, lithium tantalate ($LiTaO_3$), lithium niobate ($LiNbO_3$), aluminum nitride (AlN), scandium doped AlN (AlNSc), barium titanate ($BaTiO_3$), and zinc oxide (ZnO) disposed on the first and third substrates 206, 212.

In the multi-level AW filter package 200, first metal interconnects 230 provide interconnect paths ("signal paths") 232 for the first AW filter 202 to receive RF signals and send filtered RF signals to a contact surface 234 of the cap substrate 220. The first metal interconnects 230 are separate from at least one second metal interconnect 236, providing signal paths 238 for the second AW filter 204. In this regard, the first metal interconnects 230 are in the form of metalized vertical interconnect accesses (vias) 240 disposed through the cap substrate 220 down to the first surface 210 of the first substrate 206 to provide signal paths 232 for the first AW filter circuits 208. Further, the at least one second metal interconnect 236 ("metal interconnect 236") in a metallization layer 243 are formed on outer perimeter walls 244 of the stacked AW filters 202, 204 to provide the signal paths 238 for the second AW filter circuit 214 of the second AW filter 204, which are physically and electrically separated from the signal paths 232 of the first AW filter 202. The metal interconnects 236 provide signal paths 238 between the second AW filter circuit 214 and contact pads 246 disposed on the contact surface 234 of the cap substrate 220 of the first AW filter 202. The contact pads 246 comprise a metal or metal alloy (e.g., solder) that may be formed in a pad or bump and configured to conduct electrical signals. In this example, the metal interconnects 236 formed in the metallization layer 243 are configured to distribute signals from the contact pad 246 to the first surface 210 of the first substrate 206. As a non-limiting example, the metal interconnects 236 may be redistribution layer (RDL) interconnects formed in one or more RDL layers coupled to the contact pads 246, wherein the RDL interconnects are configured to redistribute signals from the contact pad 246 to the first surface 210 of the first substrate 206. Forming the signal paths 238 of the second AW filter 204 in the AW filter package 200 as second metal interconnect 236 of the metallization layer 243 can allow, for example, metallization layer fabrication processes to be employed to fabricate the AW filter package 200. For example if the metallization layer 243 is a RDL, a RDL fabrication process can be employed.

Surfaces on which the metal interconnects 236 can be formed in a metallization layer fabrication process (e.g. RDL fabrication processes) include surfaces parallel to a substrate (e.g., horizontal) on a first side (e.g., upper side) of the substrate, surfaces orthogonal to the substrate (e.g., vertical), or angled surfaces on the first side of the substrate. However, the metal interconnects 236 may not successfully form on angled surfaces or horizontal surfaces that are on a second side (e.g., downward side) of a substrate and not exposed from a direction orthogonal to the substrate on the first side of the substrate. For example, an metallization layer may be formed on an upward-facing surface and a continuous side wall surface but not on a downward-facing surface or a side wall surface that is shadowed by an upper substrate. In this regard, to successfully fabricate a continuous metal interconnect 236 on the outer perimeter walls 244 of the AW filter 202, 204, "negative exposure" areas, such as areas in which an upper structure overhangs a lower structure (e.g., shadowing the lower structure from the first side) can produce unreliable results in the formation of metallization layers 243. In an example regarding stacked structures, a metal interconnect can be formed on an outer perimeter wall of a stack of substrates in which side surfaces of the substrates are aligned in the Z-axis direction. However, this would require that each outer perimeter wall of the stack, on which the metal interconnects are, be aligned in the Z-axis direction. In practice, however, manufacturing tolerances of substrates can allow substrate widths to vary and substrate overlays to vary. An upper substrate in a stack having a larger width than a lower substrate in the stack, and overhanging the lower substrate on at least one side of the stack, creates a shadowed area (e.g., a negative exposure area) (e.g., in a Z-axis direction) on a second side of the overhanging upper substrate. Such a shadowed area is not exposed in a direction orthogonal to (e.g., in a Z-axis direction) the first side of the upper substrate, so the metallization layer may not be properly formed in the shadowed area.

In this regard, in another exemplary aspect, in the example of the multi-level AW filter package 200, to support the formation of the metal interconnects 236 on the outer perimeter walls 244 of the stacked AW filters 202, 204 in order to provide the signal paths 238 to the second AW filter circuit 214, a side wall surface 250 of the cap substrate 220, a side wall surface 252 of the first substrate 206, and a side wall surface 254 of the third substrate 212 can be staggered with respect to each other in a horizontal direction. Here, the phrase "staggered" means that the first substrate 206 extends in the X-axis direction beyond the side wall surface 250 of the cap substrate 220, and the third substrate 212 extends in the X-axis direction beyond the side wall surface 252 of the first substrate 206 such that the side wall surface 252 of the first substrate 206 is between the side wall surface 250 of the cap substrate 220 and a side wall surface 254 of the third substrate 212 in the X-axis direction. The staggered side wall surfaces 250, 252 create shoulder areas 256 of the first substrate 206 that extend out beyond the side wall surface 250 (see FIG. 213) of the cap substrate 220 in a direction orthogonal to the side wall surface 250 of the cap substrate 220 (e.g., in an X-axis direction). The staggered side wall surfaces 252, 254 also create, in the multi-level AW filter package 200, lower shoulder areas 258 on the third substrate 212 that extend out (e.g., in the X-axis direction) beyond a side wall surface 252 of the first substrate 206 of the AW filter package 200. The shoulder areas 256 and lower shoulder areas 258 provide support for the formation of the metal interconnects 236 on the outer perimeter walls 244 of the stacked AW filters 202, 204 using, for example, RDL fabrication processes and avoid overlaps that create negative exposure areas where the metal interconnect 236 may not be able to be formed.

With further reference to FIGS. 2A-2C, the metal interconnect 236 is disposed on the contact surface 234 of the cap substrate 220 and is electrically coupled to the contact pad 246. The contact pad 246 is configured to couple to an external circuit to receive an RF signal or provide a filtered RF signal. A signal received or generated on the contact pad 246 may be electrically coupled, through the metal interconnect 236, to one of the second AW filter circuits 214 on the third substrate 212. In this regard, the metal interconnect 236 continues from the contact surface 234 (e.g., a top surface of the AW filter package 200) onto the side wall surface 250 of the cap substrate 220. The side wall surface 250 of the cap substrate 220 extends vertically (e.g., in the Z-axis direction), which is orthogonal to the contact surface 234. The first frame 218 is disposed between the cap substrate 220 and the first surface 210 of the first substrate 206. A side wall surface 260 of the first frame 218 may extend (e.g., in the Z-axis direction) in alignment with the side wall surface 250 of the cap substrate 220 without deviating in a direction orthogonal (e.g., X-axis direction) with respect to the side wall surface 250 of the cap substrate 220. In this manner, the side wall surface 250 of the cap substrate 220 and the side wall surface 260 of the first frame 218 can allow the metal interconnect 236 to be formed by, for example, RDL fabrication processes or other metallization layer fabrication processes. The metal interconnect 236 extends from the side wall surface 250 of the cap substrate 220 onto the side wall surface 260 of the first frame 218 between the cap substrate 220 and the first substrate 206. The first frame 218 extends from the side wall surface 250 of the cap substrate 220 in a direction (X-axis direction) orthogonal to the side wall surface 250 of the cap substrate 220 on a first side $S_1$ (i.e., into the first cavity 222) of the side wall surface 250 of the cap substrate 220 to support the cap substrate 220. The first frame 218 comprises a different material than the cap substrate 220. In some examples, the first frame 218 is a polymer material formed on one of the cap substrates 220, and the first substrate 206 before the cap substrate 220 is stacked on the first substrate 206. The cap substrate 220 may be formed of glass, for example.

In some examples, the first frame 218 extends in the direction orthogonal to the side wall surface 250 of the cap substrate 220 on a second side $S_2$ of the side wall surface 250 of the cap substrate 220 onto the shoulder area 256 on the first surface 210 of the first substrate 206. In this regard, the side wall surface 260 of the first frame 218 is not aligned with the side wall surface 250 of the cap substrate 220 such that the side wall surface 260 of the first frame 218 is staggered with respect to the side wall surface 250 of the cap substrate 220, which also allows for formation of the metal interconnect 236. In such examples, the metal interconnect 236 is also disposed on a top surface 262 of the first frame 218. Thus, the metal interconnect 236 extends, in such examples, from the side wall surface 250 of the cap substrate 220 onto the top surface 262 of the first frame 218 and onto the side wall surface 260 of the first frame 218.

Following the metal interconnect 236 in the Z-axis direction along the outer perimeter walls 244 toward the third substrate 212, the metal interconnect 236 is disposed on the shoulder area 256 of the first substrate 206 and onto the side wall surface 252 of the first substrate 206. The side wall surface 252 of the first substrate 206 may be orthogonal to the first surface 210 of the first substrate 206. The second frame 224 is disposed between the first substrate 206 and the third substrate 212. A side wall surface 264 of the second frame 224 may be in alignment with the side wall surface 252 of the first substrate 206, making it possible to form metal interconnect 236 extending from the side wall surface 252 of the first substrate 206 and continue onto the side wall surface 264 of the second frame 224. The second frame 224 extends from the side wall surface 252 of the first substrate 206 in the direction (e.g., X-axis direction) orthogonal to the side wall surface 252 of the first substrate 206 to the first side $S_1$ (i.e., into the second cavity 226) to support the first substrate 206.

In some examples, the second frame 224 extends in the direction orthogonal to the side wall surface 252 of the first substrate 206 to the second side $S_2$ of the side wall surface 252 of the first substrate 206, so as to be staggered with respect to the side wall surface 252 of the first substrate 206 (i.e., the side wall surface 264 of the second frame 224 extends in the X-axis direction to the side $S_2$ of the side wall surface 252 of the first substrate 206). In such examples, the metal interconnect 236 is disposed on a top surface 266 of the second frame 224, continues onto the side wall surface 264 of the second frame 224, and is also disposed onto the lower shoulder area 258 of the third substrate 212, which is also on the second side $S_2$ of the side wall surface 264 of the second frame 224.

To electrically couple the contact pad 246 to a second AW filter circuit 214 on the second surface 216 by way of the metal interconnect 236, the metal interconnect 236 coupled to the contact pad 246 is also coupled a surface interconnect 268. The surface interconnect 268 is disposed on the second surface 216 of the third substrate 212 and extends from inside the second cavity 226 to the lower shoulder area 258 (outside the cavity). The surface interconnect 268 is coupled to both the second AW filter circuit 214 and the metal interconnect 236. The second frame 224 is disposed onto a portion of the surface interconnect 268 between the second AW filter circuit 214 inside the second cavity 226 and the metal interconnect 236 on the lower shoulder area 254. In this manner, the metal interconnect 236 electrically couples the second AW filter circuit 214 to the contact pad 246.

In another exemplary aspect, in the multi-level stacked AW filter package 200, in which the metal interconnects 236 provide the signal path 238 between the contact pads 246 and the second AW filter circuit(s) 214 on the third substrate 212, where the metal interconnects 236 extend across the first substrate 206 including first AW filter circuits 208, an insulator 270 is disposed on the side wall surface 252 of the first substrate 206 between the side wall surface 252 of the first substrate 206 and the metal interconnect 236. The first substrate 206 comprises one of the semiconductor substrate 213 with a piezoelectrical material 228 on the first surface 210. The piezoelectric material 228 protects the semiconductor substrate 213, which is a semiconductor, from electrical signals in the metal interconnect 236. In fabrication, the semiconductor substrate 213 is diced from a wafer, and the side wall surface 252 of the first substrate 206 is exposed (e.g., unprotected from electrical signals). Thus, disposing the metal interconnect 236 directly onto the side wall surface 252 of the first substrate 206, in which the at least one first AW filter circuit(s) 208 are formed, would cause the first AW filter circuits 208 to be electrically coupled to the metal interconnect 236 and, therefore, to the second AW filter circuits 214 and the contact pads 246. As a result of such electrical coupling, a current may leak through the semiconductor substrate 213 between the first AW filter circuits 208 and the second AW filter circuits 214, which can cause interference with the operation of the first and second AW filter circuits 208, 214, and also cause power loss in the AW filter package 200. In this regard, the insulator 270 is disposed on the side wall surface 252 of the first substrate 206 between the side wall surface 252 of the first substrate 206 and the metal interconnect 236 to insulate and isolate the first AW filter circuits 208 from the second AW filter circuits 214. In fabrication, the insulator 270 is disposed on the outer perimeter walls 244 of the stacked AW filters 202, 204, including the side wall surface 250 of the cap substrate 220, the side wall surface 260 of the first frame 218, and on the first surface 210 of the first substrate 206, before the metal interconnect 236 is disposed thereon. Thus, the insulator 270 is disposed between the side wall surface 250 of the cap substrate 220 and the metal interconnect 236, between the side wall surface 260 of the first frame 218 and the metal interconnect 236, and between the first surface 210 of the first substrate 206 and the metal interconnect 236.

In another aspect, the first metal interconnects 230 (i.e., the vias 240) and the second metal interconnects 236 also provide separate thermal paths for distributing heat away from the first and second AW filter circuits 208, 214 and to the contact surface 234 of the cap substrate 220 to be dissipated from the AW filter package 200. Forming the vias 240 in the cap substrate 220 may include, for example, laser drilling holes in the cap substrate 220 and filling the holes with metal to provide both electrical and thermal conduction. The vias 240 may be formed of copper, aluminum, or other metal or metals that provide electrical and thermal conductivity.

In another aspect, an objective of the multi-level stacked AW filter package 200 is to save area in an electronic device, but an area savings is not beneficial unless the resulting increase in height is acceptable for use in the electronic device. In this regard, by forming the first substrate 206 and the third substrate 212 of semiconductor substrates 213, which can be processed by IC processing methods, the first substrate 206 and the third substrate 212 can be thinned to reduce package height. In addition, forming the cap substrate 220 of glass provides additional structural integrity to the AW filter package 200 that would not be provided by more flexible capping materials, such as a polymer. As an example, the third substrate 212 may have a thickness $T_{212}$ in a first direction orthogonal to the second surface 216 in a range of sixty (60) microns (μm) to one hundred thirty (130) μm, the first substrate 206 may have a thickness $T_{206}$ in the first direction in a range of thirty (30) μm to seventy (70) μm, and the cap substrate 220 may have a thickness $T_{220}$ in a range of thirty (30) μm to seventy (70) μm. In some examples, the thickness $T_{212}$ of the third substrate 212 is less than eighty-five (85) μm, the thickness $T_{206}$ is less than fifty-five (55) μm, and the thickness $T_{220}$ of the cap substrate 220 is less than fifty-five (55) μm.

Figure 3:
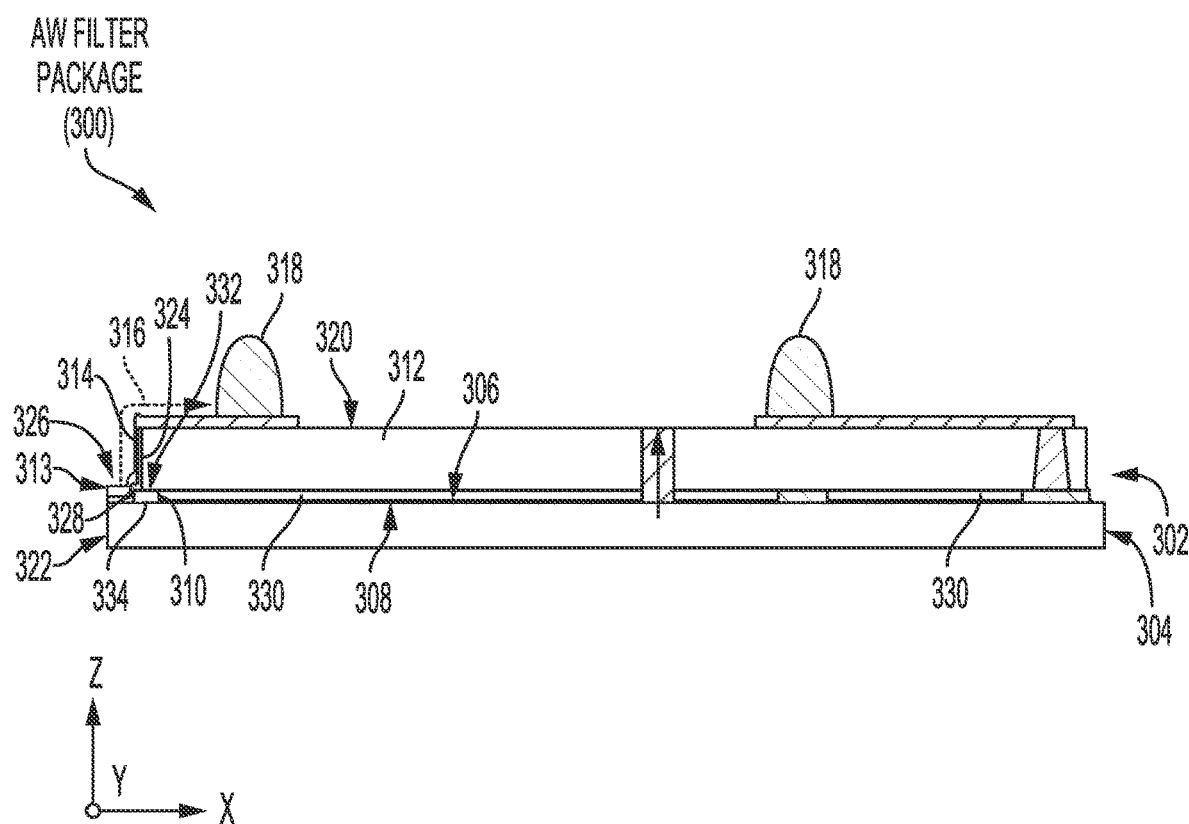
FIG. 3 is an illustration of an AW filter in a stacked AW filter package, including a second substrate stacked on a frame on a first surface of a substrate to form a cavity over an AW filter circuit on a substrate.

Exemplary aspects disclosed herein supporting a multi-level stacked AW filter package 200 as shown in FIGS. 2A-2C can also be employed in a stacked AW filter package 300, as shown in FIG. 3, that includes only a single AW filter 302 including a first substrate 304, an AW filter circuit 306 on a first surface 308 of the first substrate 304, a frame 310 disposed on the first surface 308, and a second substrate 312 disposed (e.g., stacked) on the frame 310. The second substrate 312, by being disposed on the frame 310, forms a cap structure which can also be referred to herein as "cap substrate 312." In this regard, a metallization fabrication process may be used to fabricate a metallization layer 313 comprising at least one metal interconnect 314 ("metal interconnects 314"). As a non-limiting example, the metallization layer 312 can be a RDL with RDL interconnects therein, providing signal paths 316 of the AW filter 302 even in an AW filter package 300 that does not include stacked AW filters. The metal interconnects 314 provide signal paths 316 (and thermal paths) from the first substrate 304 to contact pads 318 on a contact surface 320 of the cap substrate 312. The metal interconnects 314 are disposed on the contact surface 320 and are electrically coupled to the contact pads 318, and are also coupled to the first surface 308 of the first substrate 304.

In order to employ metallization fabrication processes, such as RDL fabrication methods as a non-limiting example, a side wall surface 322 of the first substrate 304 is staggered with respect to a side wall surface 324 of the cap substrate 312, as in the multi-level AW filter package 200 discussed above. Thus, the first surface 308 includes a shoulder area 326 that extends in a direction orthogonal to a side wall surface 324 of the cap substrate 312. The metal interconnects 314 extend onto the side wall surface 324 of the cap substrate 312. In an example in which a side wall surface 328 of the frame 310 is aligned (e.g., along an axis in the Y-axis direction) with the side wall surface 324 of the cap substrate 312, the metal interconnect 314 extends from the side wall surface 324 of the cap substrate 312 onto the side wall surface 328 of the frame 310. The frame 310 extends from the side wall surface 324 of the cap substrate 312 to a first side $S_1$ between the cap substrate 312 and the first substrate 304 to support the cap substrate 312 and provide a cavity 330. In some examples, the frame 310 is not aligned with the side wall surface 324 of the cap substrate 312. Instead, the frame 310 extends beyond the side wall surface 324 of the cap substrate 312 in a direction orthogonal to the side wall surface 324 of the cap substrate 312 to a second side $S_2$ of the side wall surface 324 of the cap substrate 312 onto the shoulder area 326 of the first substrate 304, such that the side wall surface 328 of the frame 310 is staggered with respect to the side wall surface 324 of the cap substrate 312. In this example, the metal interconnect 314 extends from the side wall surface 324 of the cap substrate 312 onto a top surface 332 of the frame 310 and onto the side wall surface 328 of the frame 310. The metal interconnect 314 is disposed onto the first surface 308 of the first substrate 304. A surface interconnect 334 disposed on the first surface 308 extends from within the cavity 330, where the surface interconnect 334 is electrically coupled to the AW filter circuit 306, past the frame 310, and into the shoulder area 326. The metal interconnect 314 is electrically coupled to the surface interconnect 334 in the shoulder area 326 to electrically couple the AW filter circuit 306 to the contact pad 318.

Figure 4:
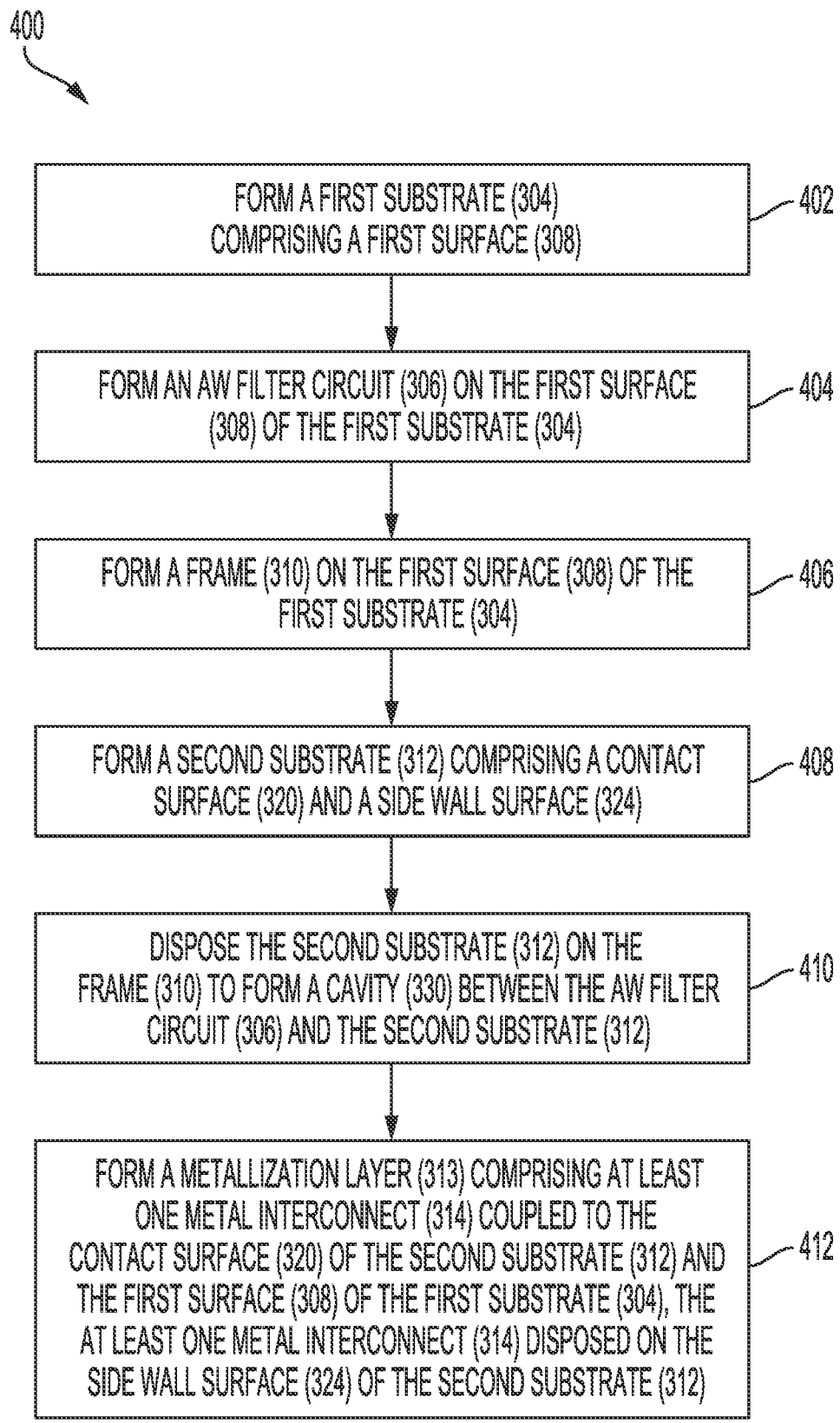
FIG. 4 is a flowchart illustrating a process of fabricating the stacked AW filter package in FIG. 3, including stacking a second substrate on a first frame on a first substrate to form a cavity over an AW filter circuit on the first substrate.

FIG. 4 is a flow chart of a process 400 of fabricating the stacked AW filter package 300. The process 400 includes forming a first substrate 304 comprising a first surface 308 (block 402) and forming an AW filter circuit 306 on the first surface 308 of the first substrate 304 (block 404). The process 400 includes forming a frame 310 on the first surface 308 of the first substrate 304 (block 406) and forming a second substrate (e.g., cap substrate) 312 comprising a contact surface 320 and a side wall surface 324 (block 408). The process 400 includes disposing the cap substrate 312 on the frame 310 to form a cavity 330 between the AW filter circuit 306 and the cap substrate 312 (block 410) and forming a metallization layer 313 comprising at least one metal interconnect 314 coupled to the contact surface 320 of the cap substrate 312 and the first surface 308 of the first substrate 304, the at least one metal interconnect 314 disposed on the side wall surface 324 of the cap substrate 312 (block 412).

Figure 5A:
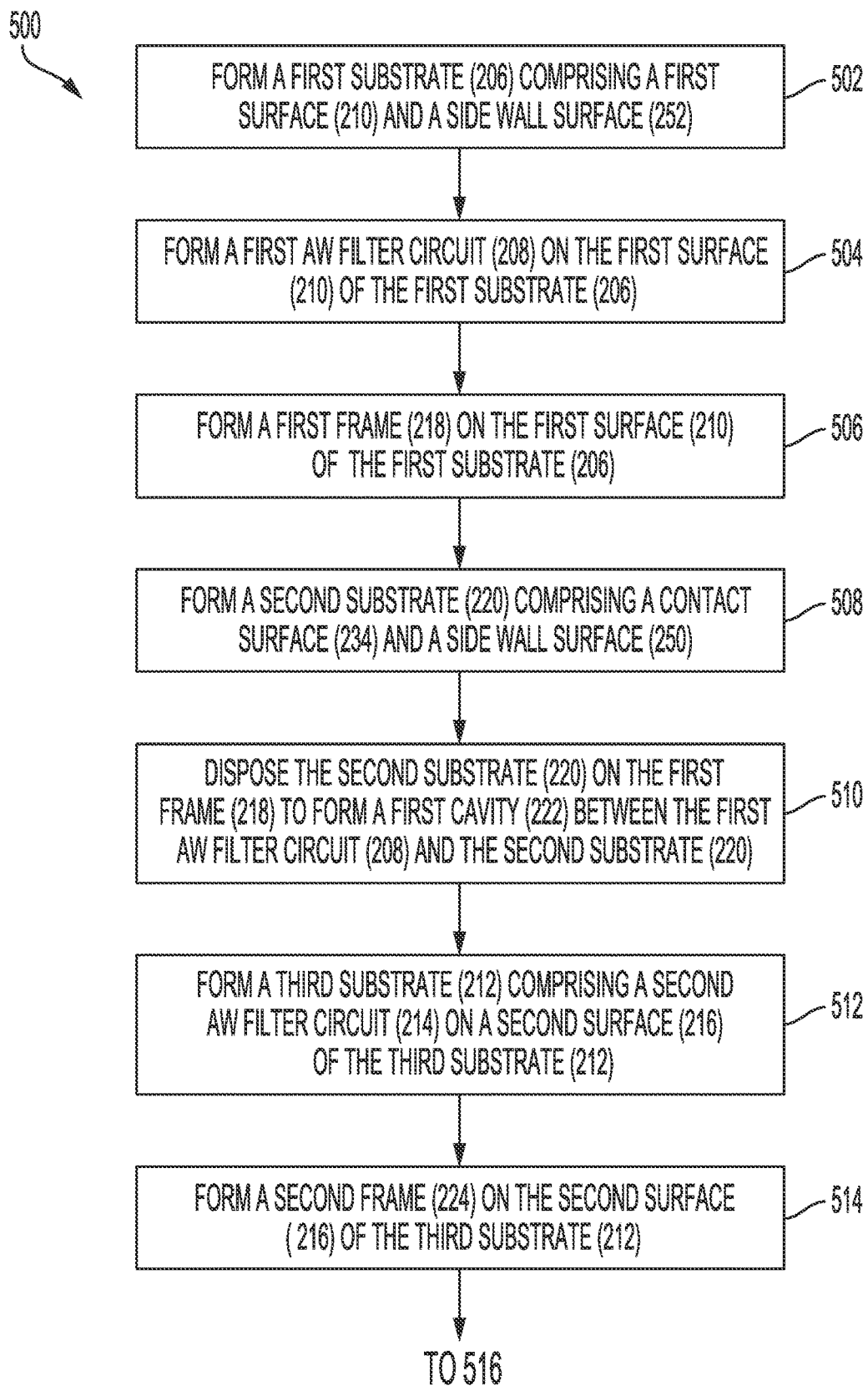
FIGS. 5A and 5B are a flowchart illustrating a process of fabricating the stacked AW filter package in FIGS. 2A-2C, including forming insulators between the outer perimeter walls of the stacked AW filters and the metal interconnects that extend between a third substrate and contact pads on a second substrate to avoid leakage current.
Figure 5B:
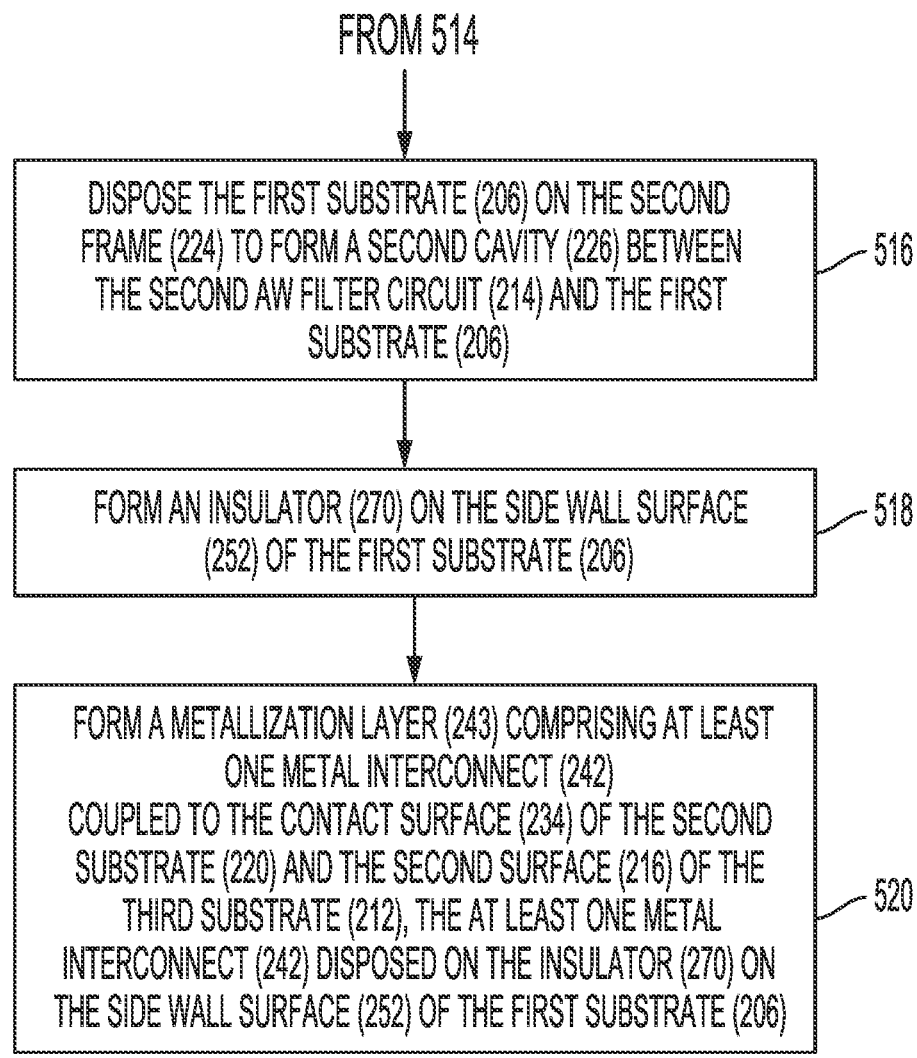

FIGS. 5A and 5B are a flow chart of a process 500 of fabricating a stacked AW filter package 200. The process 500 includes forming a first substrate 206 comprising a first surface 210 and a side wall surface 252 (block 502) and forming a first AW filter circuit 208 on the first surface 210 of the first substrate 206 (block 504). The process 500 includes forming a first frame 218 on the first surface 210 of the first substrate 206 (block 506) and forming a cap substrate 220 comprising a contact surface 234 and a side wall surface 250 (block 508). The process 500 includes disposing the cap substrate 220 on the first frame 218 to form a first cavity 222 between the first AW filter circuit 208 and the cap substrate 220 (block 510) and forming a third substrate 212 comprising a second AW filter circuit 214 on a second surface 216 of the third substrate 212 (block 512). The process 500 includes forming a second frame 224 on the second surface 216 of the third substrate 212 (block 514) and disposing the first substrate 206 on the second frame 224 to form a second cavity 226 between the second AW filter circuit 214 and the first substrate 206 (block 516). The process 500 includes forming an insulator 268 on the side wall surface 256 of the first substrate 206 (block 518) and forming metallization layer 243 comprising at least one metal interconnect (236 coupled to the contact surface 234 of the cap substrate 220 and the second surface 216 of the third substrate 212, the at least one metal interconnect (236 disposed on the insulator 270 on the side wall surface 252 of the first substrate 206 (block 520).

Figure 6:
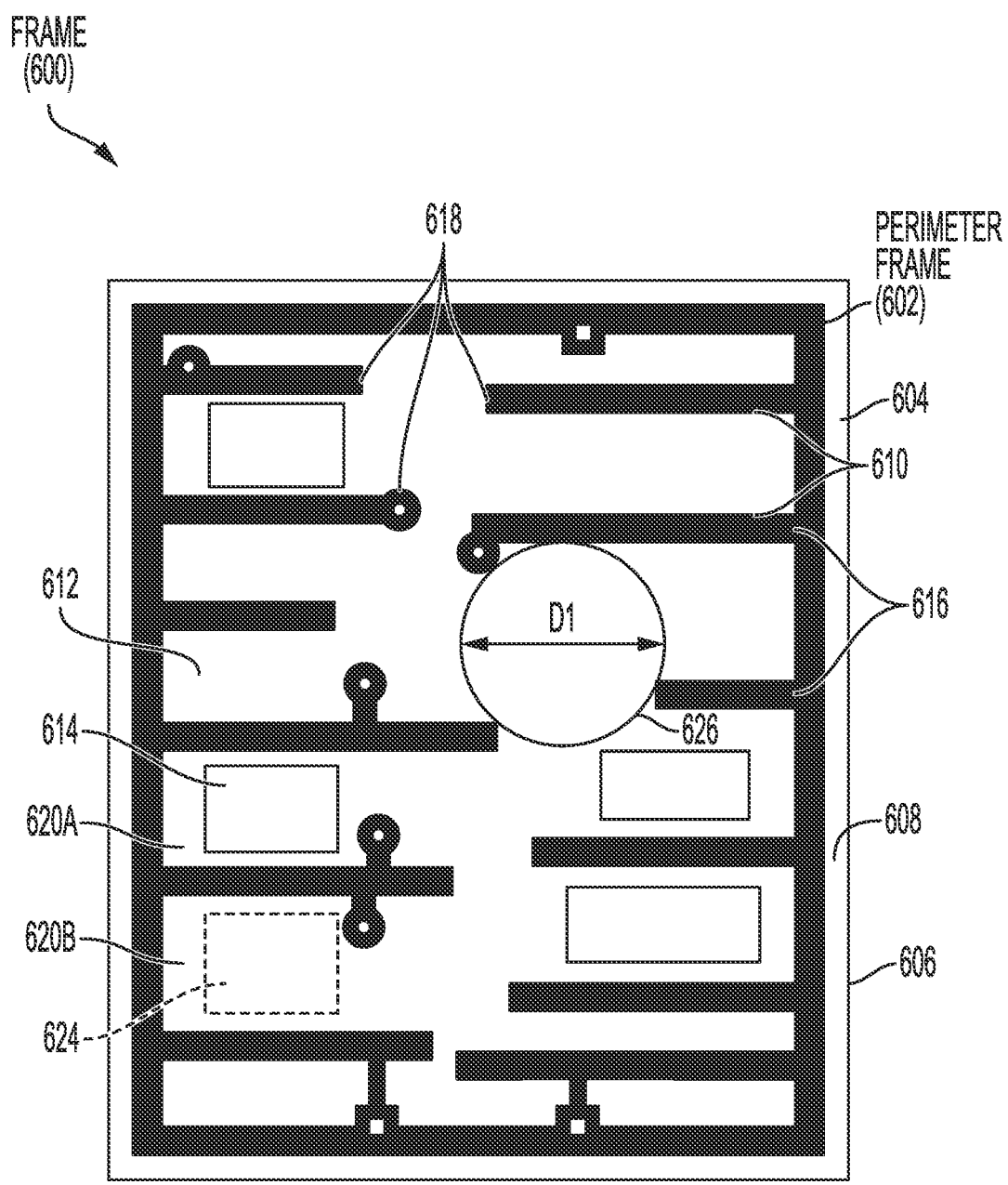
FIG. 6 is a top view of a frame on a surface of a substrate in the AW filter package in FIGS. 2A-2C and 3.

FIG. 6 is an illustration of a top view of an example of a frame 600 that supports the fabrication of stacked AW filter packages 200 and 300. The frame 600 may correspond to the frames 218 and 224 in FIGS. 2A-2C and frame 310 in FIG. 3. The frame 600 includes a perimeter frame 602 extending along a perimeter 604 of a first substrate 606, which is larger in the X-axis direction and the Y-axis direction, such that the first substrate 606 includes a shoulder area 608 that is staggered in width with respect to the frame 600. In some examples, the dimensions of the frame 600 may be the same size or slightly larger in area than a second substrate (e.g., cap substrate) to avoid "negative exposure" areas in which a metal interconnect may not be formed. The perimeter frame 602 in this example is rectangular but may be square or another shape corresponding to a perimeter of a second substrate to be supported. The frame 600 includes frame members 610 to support a second substrate against pressure on a contact surface by providing additional support so a size of a cavity 612 may be increased to include more AW filter circuits 614 on the first substrate 606. The frame members 610 extend across the cavity 612 from the perimeter frame 602. The frame members 610 may be linear, having a first end 616 in contact with and extending from the perimeter frame 602. The frame members 610 include second ends 618 in the cavity and not in contact with the perimeter frame 602. The cavity 612 continues (i.e., without interruption) around the second ends 618 from a first cavity section 620A on a first side of the frame member 610 to a second cavity section 620B on a second side of the frame member 610. An AW filter circuit 614 may be disposed in the first cavity section 620A. In some examples, another AW filter circuit 624 may be disposed in the second cavity section 620B. As shown, the frame 600 includes a plurality of the frame members 610 extending into the cavity 612 from the perimeter frame 602 to support the second substrate.

The perimeter frame 602 and the frame members 610 are in contact with a second substrate (not shown) and the first substrate 606. The frame members 610 support a stacked AW filter package by providing more support within the cavity 612 against pressure to the contact surface of a first substrate. Pressure applied to the first substrate, which may be a glass substrate, can cause inward deflection of the glass and a top substrate in a stacked AW filter package. In areas of the cavity 612 in which the frame members 610 are excluded (i.e., there are no frame members 610), the glass can deflect under pressure to a breaking point if such unsupported areas are too large. However, due to the structural rigidity of a glass second substrate, the cavity 612 of the AW filter packages, as disclosed herein, may include a circular region 626 having a diameter up to 400 µm in which the perimeter frame 602 and the frame members 610 are excluded. In some examples, the circular region 626 has a diameter (D1) in a range between 360 µm and 400 µm.

Figure 7:
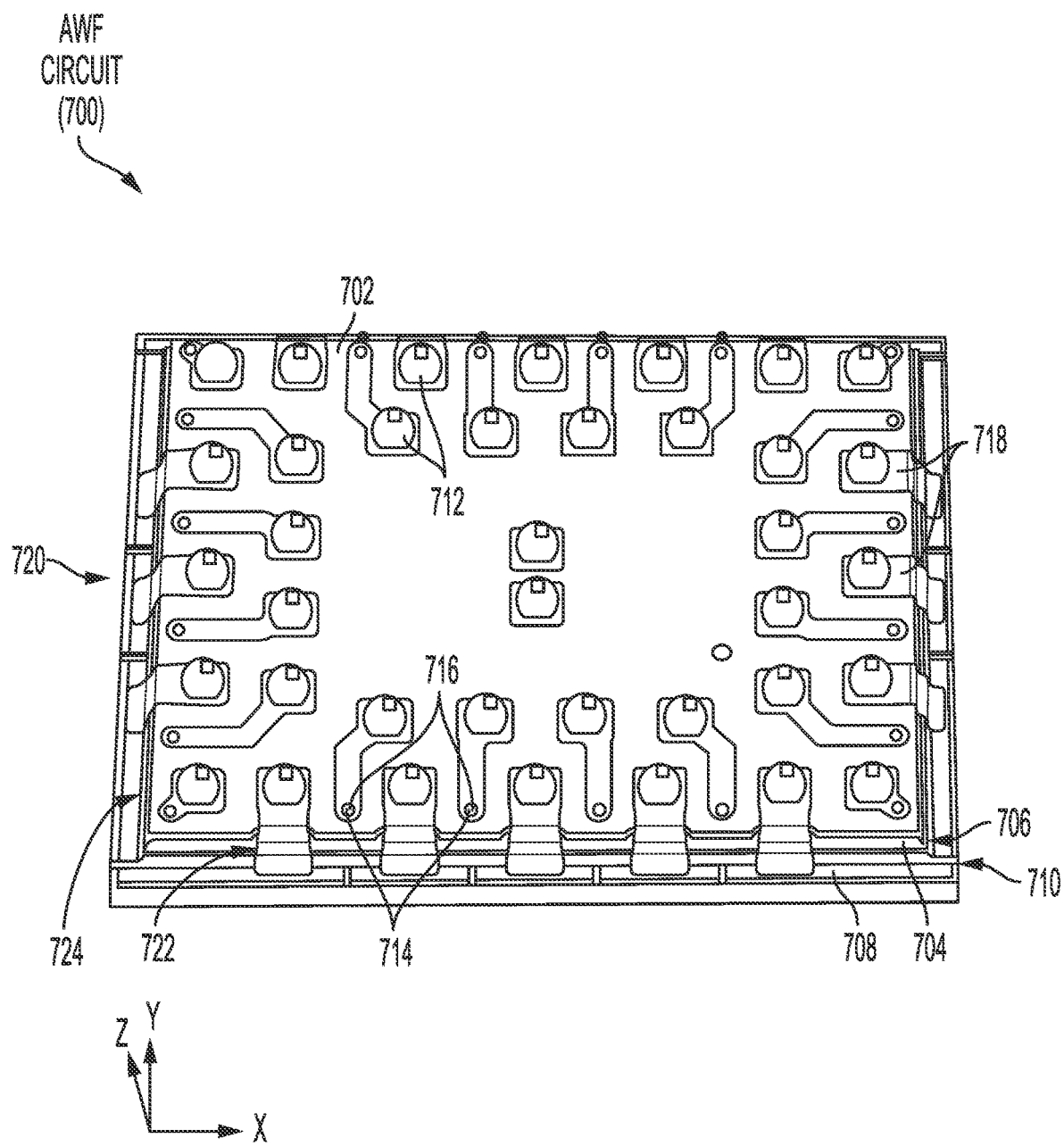
FIG. 7 is a top perspective view of an example of an AW filter circuit as illustrated in FIGS. 2A-2C.

FIG. 7 is a top perspective view of a stacked AW filter package 700. The stacked NW filter package 700 includes a second substrate 702 stacked above a first substrate 704 to form a first AW filter 706. The second substrate 702, by being disposed above the first substrate 704, forms a cap structure which can also be referred to herein as "cap substrate 702." The first AW filter 706 also provides a cap structure as stacked on a third substrate 708 to form a second AW filter 710. The stacked AW filter package 700 includes contact pads 712 on the cap substrate 702. The contact pads 712 couple to the first metal interconnects 714, which comprise vias 716 that extend through the cap substrate 702 to couple to first AW filter circuits (not shown) on the first substrate 704. Second metal interconnects 718 (which may be RDL interconnects) extend from the contact pads 712 along outer perimeter walls 720 to the second AW filter 710. The second metal interconnects 718 are disposed on insulators 722 on a side wall surface 724 of the first substrate 704 to couple the contact pads 712 to second AW filter circuits (not shown) on the third substrate 708 without electrically coupling to the semiconductor material of the first substrate 704.

Figure 8:
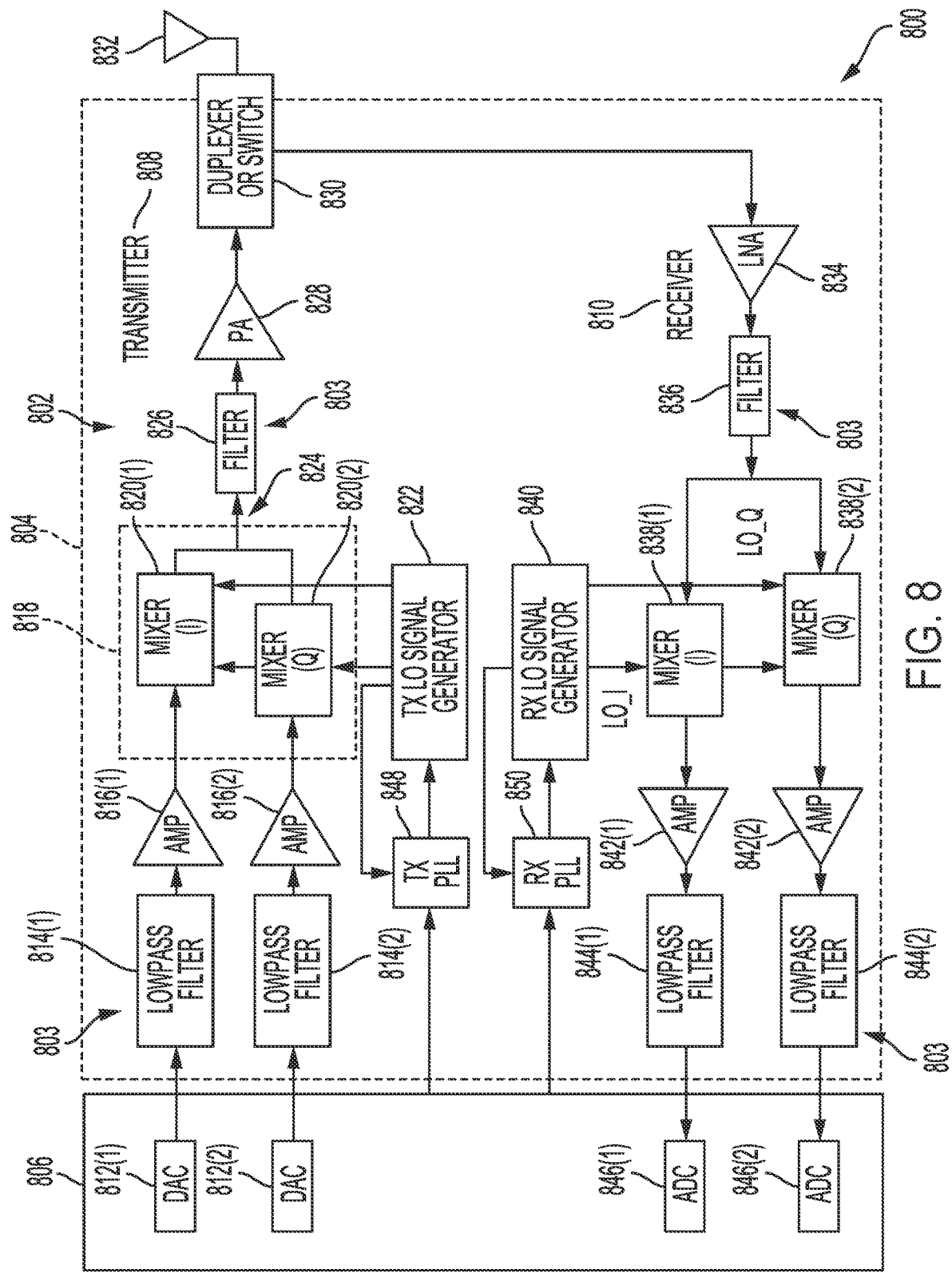
FIG. 8 is a block diagram of an exemplary wireless communications device that includes a radio frequency (RF) module including AW filter packages including a first AW filter circuit on a first substrate protected in a cavity by a second substrate stacked on a frame on the first substrate, and also including insulators between the first substrate and metal interconnects extending from a contact pad on the second substrate to a third substrate stacked on a backside of the first substrate, as illustrated in FIGS. 2A-2C, 3, and 7.

FIG. 8 illustrates an exemplary wireless communications device 800 that includes RF components formed from one or more ICs 802 and can include stacked AW filter packages 803. The stacked AW filter packages 803 include a first AW filter circuit disposed on a first substrate, a second substrate disposed on a first frame disposed on the first substrate, and the first substrate disposed on a second frame disposed on a third substrate to enclose a second, bottom AW filter circuit, wherein contact pads on the second substrate are electrically coupled to the second AW filter circuit by metal interconnects disposed on insulators to protect against leakage currents to the first substrate, as illustrated in FIGS. 2A-2C, 3 and 7, and according to any of the aspects disclosed herein. The wireless communications device 800 may include or be provided in any of the above-referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RFICs, mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes digital-to-analog converters (DACs) 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. The lowpass filters 814(1), 814(2) may be implemented as AW filter packages 803. Amplifiers (AMPS) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals from a TX LO signal generator 822 through mixers 820(1), 820(2) to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RE signal is routed through a duplexer or switch 830 and transmitted via an antenna 832. Any of the lowpass filters 814(1) and 814(2), or the filter 826, may be an acoustic wave filter (AW filter) packages 803.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by AMPs 842(1), 842(2) and further filtered by lowpass filters 844(1), 844(2) to obtain I and Q analog input signals, which are provided to the data processor 806. Any of the filter 836 and the lowpass filters 844(1), 844(2) may be AW filter packages 803. In this example, the data processor 806 includes analog-to-digital converters (ADCs) 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Wireless communications devices 800 that can each include stacked AW filter packages 803 including a second substrate stacked on a first substrate comprising a first AW filter circuit further stacked on a third substrate comprising a second AW filter circuit, wherein contact pads on the second substrate are electrically coupled to the second AW filter circuit by metal interconnects disposed on insulators to protect against leakage currents to the first substrate, as illustrated in FIGS. 2A-2C, 3 and 7, and according to any of the aspects disclosed herein, may be provided in or integrated into any processor-based device. Examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 9:
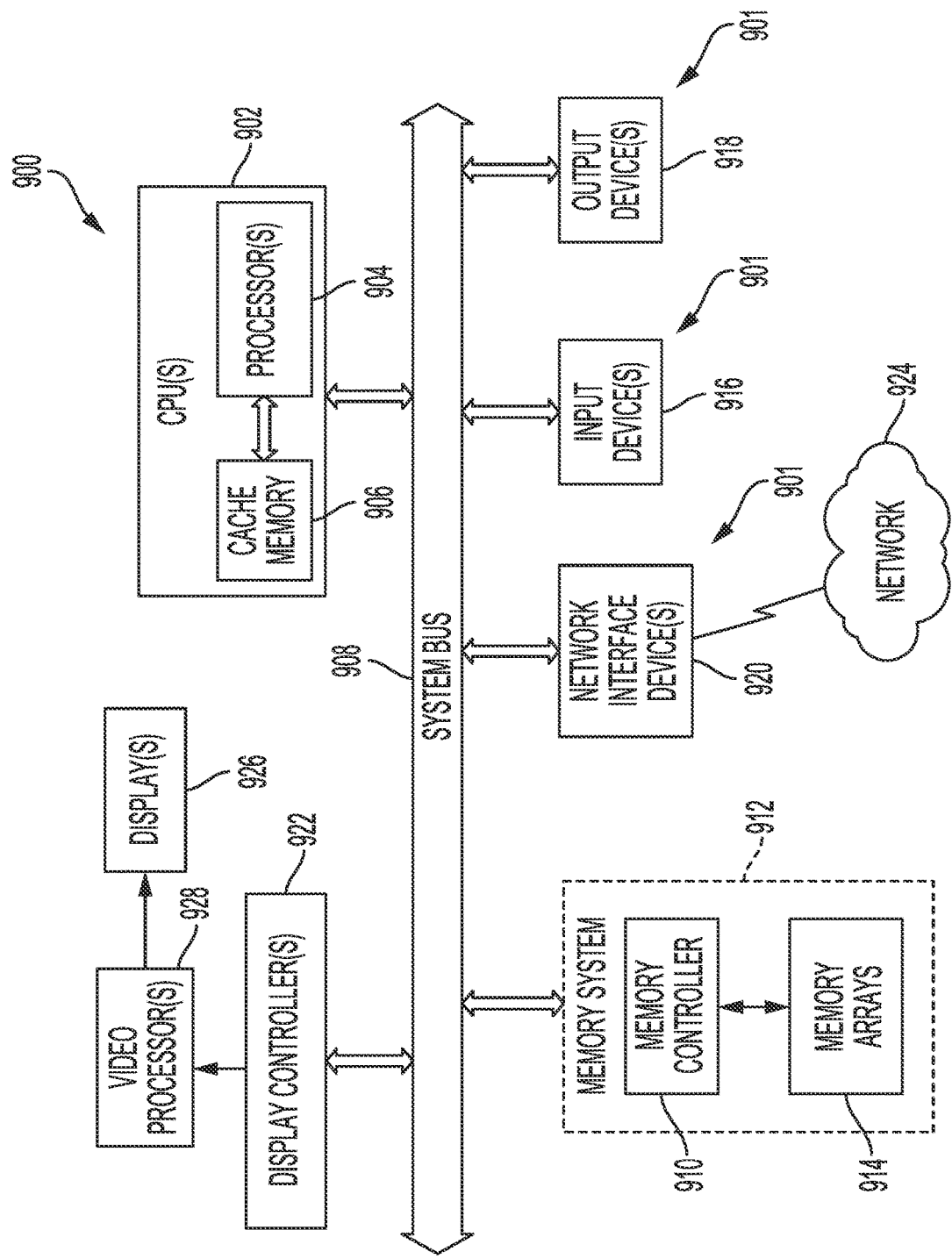
FIG. 9 is a block diagram of an exemplary processor-based system that can include AW filter packages, including a first AW filter circuit on a first substrate protected in a cavity by a second substrate stacked on a frame on the substrate, and also including insulators between the first substrate and metal interconnects extending from a contact pad on the second substrate to a third substrate stacked on a backside of the substrate, as illustrated in FIGS. 2A-2C, 3, and 7, and according to any of the aspects disclosed herein.

In this regard, FIG. 9 illustrates an example of a processor-based system 900 including RF circuits including stacked AW filter packages 901. The stacked AW filter packages 901 include a first AW filter circuit disposed on a first substrate, a second substrate disposed on a first frame disposed on the first substrate, and the first substrate disposed on a second frame disposed on a third substrate to enclose a second, bottom AW filter circuit, wherein contact pads on the second substrate are electrically coupled to the second AW filter circuit by metal interconnects disposed on insulators to protect against leakage currents to the first substrate, as illustrated in FIGS. 2A-2C, 3, and 7, and according to any aspects disclosed herein. In this example, the processor-based system 900 includes one or more central processor units (CPUs) 902, which may also be referred to as CPU or processor cores, each including one or more processors 904. The CPU(s) 902 may have cache memory 906 coupled to the processor(s) 904 for rapid access to temporarily stored data. The CPU(s) 902 is coupled to a system bus 908 and can intercouple master and slave devices included in the processor-based system 900. As is well known, the CPU(s) 902 communicates with these other devices by exchanging address, control, and data information over the system bus 908. For example, the CPU(s) 902 can communicate bus transaction requests to a memory controller 910 as an example of a slave device. Although not illustrated in FIG. 9, multiple system buses 908 could be provided; wherein each system bus 908 constitutes a different fabric.

Other master and slave devices can be connected to the system bus 908. As illustrated in FIG. 9, these devices can include a memory system 912 that includes the memory controller 910 and one or more memory arrays 914, one or more input devices 916, one or more output devices 918, one or more network interface devices 920, and one or more display controllers 922, as examples. Each of the memory system 912, the one or more input devices 916, the one or more output devices 918, the one or more network interface devices 920, and the one or more display controllers 922 can include RF circuits including stacked AW filter packages

901. The stacked AW filter packages 901 include a first AW filter circuit disposed on a first substrate, a second substrate disposed on a first frame disposed on the first substrate, and the first substrate disposed on a second frame disposed on a third substrate to enclose a second, bottom AW filter circuit, wherein contact pads on the second substrate are electrically coupled to the second AW filter circuit by metal interconnects disposed on insulators to protect against leakage currents to the first substrate, as illustrated in FIGS. 2A-2C, 3, and 7, and according to any of the aspects disclosed herein. The input device(s) 916 can include any type of input device, including, but not limited to, input keys, switches, voice processors, etc. The output device(s) 918 can include any type of output device, including, but not limited to, audio, video, other visual indicators, etc. The network interface device(s) 920 can be any device configured to allow an exchange of data to and from a network 924. The network 924 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 920 can be configured to support any type of communications protocol desired.

The CPU(s) 902 may also be configured to access the display controller(s) 922 over the system bus 908 to control information sent to one or more displays 926. The display controller(s) 922 sends information to the display(s) 926 to be displayed via one or more video processors 928, which process the information to be displayed into a format suitable for the display(s) 926. The display(s) 926 can include any type of display, including, hut not limited to, a cathode ray tube (CRT), a liquid crystal display (LCD), a plasma display, a light-emitting diode (LED) display, etc. The display controller(s) 922, display(s) 926, and/or the video processor(s) 928 can include RF circuits including stacked AW filter packages 901. The stacked AW filter packages 901 include a first AW filter circuit disposed on a first substrate, a second substrate disposed on a first frame disposed on the first substrate, and the first substrate disposed on a second frame disposed on a third substrate to enclose a second, bottom AW filter circuit, wherein contact pads on the second substrate are electrically coupled to the second AW filter circuit by metal interconnects disposed on insulators to protect against leakage currents to the first substrate, as illustrated in FIGS. 2A-2C, 3, and 7, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. A stacked acoustic wave (AW) filter package, comprising:
    a first substrate comprising a first surface;
    an AW filter circuit on the first surface of the first substrate;
    a frame disposed on the first surface of the first substrate;
    a second substrate comprising a contact surface and a side wall surface, the second substrate disposed on the frame to form a cavity between the AW filter circuit and the second substrate; and
    a metallization layer comprising at least one metal interconnect coupled to the contact surface of the second substrate and the first surface of the first substrate, the at least one metal interconnect disposed on the side wall surface of the second substrate.
2. The stacked AW filter package of clause 1, further comprising a contact pad coupled to the contact surface;
    the at least one metal interconnect configured to redistribute signals from the contact pad to the first surface of the first substrate.
3. The stacked AW filter package of clause 1 or clause 2, wherein:
    the frame is disposed between the second substrate and the first surface of the first substrate, extending from the side wall surface of the second substrate in a direction orthogonal to the side wall surface of the second substrate on a first side of the side wall surface of the second substrate; and
    the first surface of the first substrate includes a shoulder area on a second side of the side wall surface of the second substrate in the direction orthogonal to the side wall surface of the second substrate.
4. The stacked AW filter package of clause 3, wherein:
    the at least one metal interconnect is disposed on the shoulder area of the first surface of the first substrate.
5. The stacked AW filter package of any of clauses 1-4, further comprising a contact pad on the contact surface, the contact pad configured to couple to an external circuit, wherein the at least one metal interconnect is electrically coupled to the contact pad.
6. The stacked AW filter package of any of clauses 2-5, further comprising a surface interconnect on the first surface of the first substrate extending from inside the cavity to the shoulder area, the surface interconnect electrically coupled to the AW filter circuit, and the at least one metal interconnect of the metallization layer on the shoulder area.
7. The stacked AW filter package of any of clauses 1-6, wherein the at least one metal interconnect of the metallization layer is disposed on a side surface of the frame between the second substrate and the first substrate.
8. The stacked AW filter package of any of clauses 2-7, wherein:
    the frame extends in the direction orthogonal to the side wall surface of the second substrate into the shoulder area on the second side of the side wall surface of the second substrate; and
    the at least one metal interconnect of the metallization layer is disposed on a top surface of the frame.
9. The stacked AW filter package of any of clauses 1-8, wherein the frame comprises a first material, and the second substrate comprises a second material different than the first material,
10. The stacked AW filter package of any of clauses 1-9, wherein:
    the frame comprises a polymer material;
    the second substrate comprises a glass; and
    the first substrate comprises a semiconductor material
11. The stacked AW filter package of any of clauses 1-10, wherein:
    the frame further comprises a perimeter frame disposed along a perimeter of the second substrate; and
    the cavity is surrounded by e perimeter frame.
12. The stacked AW filter package of clause 11, wherein the frame further comprises a frame member extending into the cavity, orthogonal to at least a portion of the perimeter frame.
13. The stacked AW filter package of clause 12, wherein the frame member comprises one of a plurality of frame members of the frame.
14. The stacked AW filter package of clause 12 or clause 13, the frame member further comprising a linear frame member comprising a first end coupled to the perimeter frame.
15. The stacked AW filter package of clause 14, the cavity comprising a continuous cavity extending from a first cavity section on a first side of the linear frame member and around a second end of the linear frame member to a second cavity section on a second side of the linear frame member.
16. The stacked AW filter package of clause 15, wherein:
    the AW filter circuit on the first surface of the first substrate is a first AW filter circuit;
    the first AW filter circuit is disposed in the first cavity section on the first side of the linear frame member; and
    the stacked AW filter package further comprises another AW filter circuit on the second side of the linear frame member.
17. The stacked A filter package of any of clauses 1-16, wherein the cavity comprises a continuous circular region having a diameter up to 400 micrometers (μm) from which the frame is excluded.
18. The stacked AW filter package of any of clauses 1-17, wherein the diameter of the continuous circular region is greater than 360 μm.
19. The stacked AW filter package of clause 5, the stacked AW filter package further comprising:
    a third substrate comprising a second AW filter circuit on a second surface of the third substrate; and
    a second frame disposed on the second surface of the third substrate;
    wherein:
    the first substrate is disposed on the second frame to form a second cavity between the second AW filter circuit and the first substrate.
20. The stacked AW filter package of clause 19, wherein:
    the first substrate further comprises a side wall surface orthogonal to the first surface of the first substrate;
    the second frame is disposed between the first substrate and the second surface of the third substrate, extending from the side wall surface of the first substrate in a direction orthogonal to the side wall surface of the first substrate on a first side of the side wall surface of the first substrate; and the second surface of the third substrate includes a lower shoulder area on a second side of the side wall surface of the first substrate in the direction orthogonal to the first side wall surface of the first substrate.

21. The stacked AW filter package of clause 20, wherein:
the at least one metal interconnect is disposed on:
the side wall surface of the first substrate; and
the lower shoulder area of the second surface of the third substrate.

22. The stacked AW filter package of clause 21, further comprising a surface interconnect on the second surface of the third substrate extending from inside the second cavity to the lower shoulder area, the surface interconnect electrically coupled to the second AW filter circuit, and the at least one metal interconnect on the lower shoulder area.

23. The stacked AW filter package of any of clauses 19-22, wherein the at least one metal interconnect is disposed on a side surface of the second frame between the first substrate and the third substrate.

24. The stacked AW filter package of any of clauses 20-23, wherein:
the second frame extends in the direction orthogonal to the side wall surface of the first substrate onto the lower shoulder area on the second side of the side wall surface of the first substrate; and
the at least one metal interconnect is disposed on a top surface of the second frame.

25. A method of fabricating a stacked acoustic wave (AW) filter package, the method comprising:
forming a first substrate comprising a first surface;
forming an AW filter circuit on the first surface of the first substrate;
forming a frame on the first surface of the first substrate;
forming a second substrate comprising a contact surface and a side wall surface;
disposing the second substrate on the frame to form a cavity between the AW filter circuit and the second substrate; and
forming a metallization layer comprising at least one metal interconnect coupled to the contact surface of the second substrate and the first surface of the first substrate, the at least one metal interconnect disposed on the side wall surface of the second substrate.

26. The method of clause 25, further comprising:
disposing the frame between the second substrate and the first surface of the first substrate, and extending from the side wall surface of the second substrate in a direction orthogonal to the side wall surface of the second substrate on a first side of the side wall surface of the second substrate; and
forming a shoulder area of the first surface of the first substrate on a second side of the side wall surface of the second substrate in the direction orthogonal to the side wall surface of the second substrate.

27. A stacked acoustic wave (AW) filter package, comprising:
a first substrate comprising a first surface and a side wall surface;
a first AW filter circuit on the first surface of the first substrate;
a first frame disposed on the first surface of the first substrate;
a second substrate comprising a contact surface and a side wall surface, the second substrate disposed on the first frame to form a first cavity between the first AW filter circuit and the second substrate;
a third substrate comprising a second AW filter circuit on a second surface of the third substrate;
a second frame disposed on the second surface of the third substrate;
the first substrate disposed on the second frame to form a second cavity between the second AW filter circuit and the first substrate;
a metallization layer comprising at least one metal interconnect coupled to the contact surface of the second substrate and the second surface of the third substrate, the at least one metal interconnect disposed on the side wall surface of the first substrate; and
an insulator disposed on the side wall surface of the first substrate between the side wall surface of the first substrate and the at least one metal interconnect.

28. The stacked AW filter package of clause 27, wherein the insulator is disposed between the at least one metal interconnect and the first rate.

29. The stacked AW filter package of clause 27 or clause 28, wherein the insulator is disposed between the at least one metal interconnect and the first surface of the first substrate.

30. The stacked AW filter package of any of clauses 27-29, wherein the insulator is disposed between the at least one metal interconnect and the side wall surface of the second substrate.

31. The stacked AW filter package of any of any of clauses 27-30, further comprising a via extending through the second substrate from the contact surface to the first surface of the first substrate.

32. The stacked AW filter package of clause 31, further comprising a contact on the contact surface, wherein:
the contact pad is configured to conduct electrical signals; and
the via is configured to electrically couple the first AW circuit to the contact pad.

33. The stacked AW filter package of any of clauses 27-32, wherein:
a thickness of the third substrate, in a first direction orthogonal to a second surface, is in a range of 60 to 130 micrometers ($\mu m$);
a thickness of the first substrate in the first direction is in a range of 30 to 70 $\mu m$; and
a thickness of the second substrate in the first direction is in a range of 30 to 70 $\mu m$.

34. The stacked AW filter package of any of clauses 27-33, wherein:
the thickness of the first substrate is less than 85 $\mu m$;
the thickness of the third substrate is less than 55 $\mu m$; and
the thickness of the second substrate is less than 55 $\mu m$.

35. A method of forming a stacked acoustic wave filter (AW filter) package, comprising:
forming a first substrate comprising a first surface and a side wall surface;
forming a first AW filter circuit on the first surface of the first substrate;
forming a first frame on the first surface of the first substrate;
forming a second substrate comprising a contact surface and a side wall surface;
disposing the second substrate on the first frame to form a first cavity between the first AW filter circuit and the second substrate;

forming a third substrate comprising a second AW filter circuit on a second surface of the third substrate;
forming a second frame on the second surface of the third substrate;
disposing the first substrate on the second frame to form a second cavity between the second AW filter circuit and the first substrate;
forming an insulator on the side wall surface of the first substrate; and
forming a metallization layer comprising at least one metal interconnect coupled to the contact surface of the second substrate and the second surface of the third substrate, the at least one metal interconnect disposed on the insulator on the side wall surface of the first substrate.

What is claimed is:

1. A stacked acoustic wave (AW) filter package, comprising:
    a first substrate comprising a first surface;
    an AW filter circuit on the first surface of the first substrate;
    a frame disposed on the first surface of the first substrate;
    a second substrate comprising a contact surface and a side wall surface, the second substrate disposed on the frame to form a cavity between the AW filter circuit and the second substrate; and
    a metallization layer comprising at least one metal interconnect coupled to the contact surface of the second substrate and the first surface of the first substrate, the at least one metal interconnect disposed on the side wall surface of the second substrate;
    wherein the frame further comprises a perimeter frame disposed along a perimeter of the second substrate, and a frame member extending into the cavity, orthogonal to at least a portion of the perimeter frame, and
    wherein the cavity is surrounded by the perimeter frame.

2. The stacked AW filter package of claim 1, further comprising a contact pad coupled to the contact surface;
    the at least one metal interconnect configured to redistribute signals from the contact pad to the first surface of the first substrate.

3. The stacked AW filter package of claim 1, wherein:
    the frame is disposed between the second substrate and the first surface of the first substrate, extending from the side wall surface of the second substrate in a direction orthogonal to the side wall surface of the second substrate on a first side of the side wall surface of the second substrate; and
    the first surface of the first substrate includes a shoulder area on a second side of the side wall surface of the second substrate in the direction orthogonal to the side wall surface of the second substrate.

4. The stacked AW filter package of claim 3, wherein:
    the at least one metal interconnect is disposed on the shoulder area of the first surface of the first substrate.

5. The stacked AW filter package of claim 4, further comprising a contact pad on the contact surface, the contact pad configured to couple to an external circuit, wherein the at least one metal interconnect is electrically coupled to the contact pad.

6. The stacked AW filter package of claim 4, further comprising a surface interconnect on the first surface of the first substrate extending from inside the cavity to the shoulder area, the surface interconnect electrically coupled to the AW filter circuit, and the at least one metal interconnect of the metallization layer on the shoulder area.

7. The stacked AW filter package of claim 6, wherein the at least one metal interconnect of the metallization layer is disposed on a side surface of the frame between the second substrate and the first substrate.

8. The stacked AW filter package of claim 7, wherein:
    the frame extends in the direction orthogonal to the side wall surface of the second substrate into the shoulder area on the second side of the side wall surface of the second substrate; and
    the at least one metal interconnect of the metallization layer is disposed on a top surface of the frame.

9. The stacked AW filter package of claim 1, wherein the frame comprises a first material, and the second substrate comprises a second material different than the first material.

10. The stacked AW filter package of claim 9, wherein:
    the frame comprises a polymer material;
    the second substrate comprises a glass; and
    the first substrate comprises a semiconductor material.

11. The stacked AW filter package of claim 1, wherein the frame member comprises one of a plurality of frame members of the frame.

12. The stacked AW filter package of claim 1, the frame member further comprising a linear frame member comprising a first end coupled to the perimeter frame.

13. The stacked AW filter package of claim 12, the cavity comprising a continuous cavity extending from a first cavity section on a first side of the linear frame member and around a second end of the linear frame member to a second cavity section on a second side of the linear frame member.

14. The stacked AW filter package of claim 13, wherein:
    the AW filter circuit on the first surface of the first substrate is a first AW filter circuit;
    the first AW filter circuit is disposed in the first cavity section on the first side of the linear frame member; and
    the stacked AW filter package further comprises another AW filter circuit on the second side of the linear frame member.

15. The stacked AW filter package of claim 1, wherein the cavity comprises a continuous circular region having a diameter up to 400 micrometers (μm) from which the frame is excluded.

16. The stacked AW filter package of claim 15, wherein the diameter of the continuous circular region is greater than 360 μm.

17. The stacked AW filter package of claim 5, the stacked AW filter package further comprising:
    a third substrate comprising a second AW filter circuit on a second surface of the third substrate; and
    a second frame disposed on the second surface of the third substrate;
    wherein:
    the first substrate is disposed on the second frame to form a second cavity between the second AW filter circuit and the first substrate.

18. The stacked AW filter package of claim 17, wherein:
    the first substrate further comprises a side wall surface orthogonal to the first surface of the first substrate;
    the second frame is disposed between the first substrate and the second surface of the third substrate, extending from the side wall surface of the first substrate in a direction orthogonal to the side wall surface of the first substrate on a first side of the side wall surface of the first substrate; and
    the second surface of the third substrate includes a lower shoulder area on a second side of the side wall surface of the first substrate in the direction orthogonal to the first side wall surface of the first substrate.

19. The stacked AW filter package of claim 18, wherein:
the at least one metal interconnect is disposed on:
the side wall surface of the first substrate; and
the lower shoulder area of the second surface of the third substrate.

20. The stacked AW filter package of claim 19, further comprising a surface interconnect on the second surface of the third substrate extending from inside the second cavity to the lower shoulder area, the surface interconnect electrically coupled to the second AW filter circuit, and the at least one metal interconnect on the lower shoulder area.

21. The stacked AW filter package of claim 19, wherein the at least one metal interconnect is disposed on a side surface of the second frame between the first substrate and the third substrate.

22. The stacked AW filter package of claim 21, wherein:
the second frame extends in the direction orthogonal to the side wall surface of the first substrate onto the lower shoulder area on the second side of the side wall surface of the first substrate; and
the at least one metal interconnect is disposed on a top surface of the second frame.

23. A method of fabricating a stacked acoustic wave (AW) filter package, the method comprising:
forming a first substrate comprising a first surface;
forming an AW filter circuit on the first surface of the first substrate;
forming a frame on the first surface of the first substrate;
forming a second substrate comprising a contact surface and a side wall surface;
disposing the second substrate on the frame to form a cavity between the AW filter circuit and the second substrate; and
forming a metallization layer comprising at least one metal interconnect coupled to the contact surface of the second substrate and the first surface of the first substrate, the at least one metal interconnect disposed on the side wall surface of the second substrate;
wherein the frame further comprises a perimeter frame disposed along a perimeter of the second substrate, and a frame member extending into the cavity, orthogonal to at least a portion of the perimeter frame, and
wherein the cavity is surrounded by the perimeter frame.

24. The method of claim 23, further comprising:
disposing the frame between the second substrate and the first surface of the first substrate, and extending from the side wall surface of the second substrate in a direction orthogonal to the side wall surface of the second substrate on a first side of the side wall surface of the second substrate; and
forming a shoulder area of the first surface of the first substrate on a second side of the side wall surface of the second substrate in the direction orthogonal to the side wall surface of the second substrate.

25. A stacked acoustic wave (AW) filter package, comprising:
a first substrate comprising a first surface and a side wall surface;
a first AW filter circuit on the first surface of the first substrate;
a first frame disposed on the first surface of the first substrate;
a second substrate comprising a contact surface and a side wall surface, the second substrate disposed on the first frame to form a first cavity between the first AW filter circuit and the second substrate;
a third substrate comprising a second AW filter circuit on a second surface of the third substrate;
a second frame disposed on the second surface of the third substrate;
the first substrate disposed on the second frame to form a second cavity between the second AW filter circuit and the first substrate;
a metallization layer comprising at least one metal interconnect coupled to the contact surface of the second substrate and the second surface of the third substrate, the at least one metal interconnect disposed on the side wall surface of the first substrate; and
an insulator disposed on the side wall surface of the first substrate between the side wall surface of the first substrate and the at least one metal interconnect.

26. The stacked AW filter package of claim 25, wherein the insulator is disposed between the at least one metal interconnect and the first frame.

27. The stacked AW filter package of claim 25, wherein the insulator is disposed between the at least one metal interconnect and the first surface of the first substrate.

28. The stacked AW filter package of claim 25, wherein the insulator is disposed between the at least one metal interconnect and the side wall surface of the second substrate.

29. The stacked AW filter package of claim 26, further comprising a via extending through the second substrate from the contact surface to the first surface of the first substrate.

30. The stacked AW filter package of claim 29, further comprising a contact pad on the contact surface, wherein:
the contact pad is configured to conduct electrical signals; and
the via is configured to electrically couple the first AW circuit to the contact pad.

31. The stacked AW filter package of claim 26, wherein:
a thickness of the third substrate, in a first direction orthogonal to a second surface, is in a range of 60 to 130 micrometers (µm);
a thickness of the first substrate in the first direction is in a range of 30 to 70 µm; and
a thickness of the second substrate in the first direction is in a range of 30 to 70 µm.

32. The stacked AW filter package of claim 31, wherein:
the thickness of the first substrate is less than 85 µm;
the thickness of the third substrate is less than 55 µm; and
the thickness of the second substrate is less than 55 µm.

33. A method of forming a stacked acoustic wave filter (AW filter) package, comprising:
forming a first substrate comprising a first surface and a side wall surface;
forming a first AW filter circuit on the first surface of the first substrate;
forming a first frame on the first surface of the first substrate;
forming a second substrate comprising a contact surface and a side wall surface;
disposing the second substrate on the first frame to form a first cavity between the first AW filter circuit and the second substrate;
forming a third substrate comprising a second AW filter circuit on a second surface of the third substrate;
forming a second frame on the second surface of the third substrate;
disposing the first substrate on the second frame to form a second cavity between the second AW filter circuit and the first substrate;

forming an insulator on the side wall surface of the first substrate; and forming a metallization layer comprising at least one metal interconnect coupled to the contact surface of the second substrate and the second surface of the third substrate, the at least one metal interconnect disposed on the insulator on the side wall surface of the first substrate.

* * * * *